US008683302B2

(12) United States Patent
Okamura et al.

(10) Patent No.: US 8,683,302 B2
(45) Date of Patent: Mar. 25, 2014

(54) CODING DEVICE, DECODING DEVICE, CODING METHOD, DECODING METHOD, AND COMMUNICATION SYSTEM

(75) Inventors: Shutai Okamura, Osaka (JP); Kunihiko Sakaibara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 230 days.

(21) Appl. No.: 13/127,560

(22) PCT Filed: Sep. 17, 2010

(86) PCT No.: PCT/JP2010/005700

§ 371 (c)(1), (2), (4) Date: May 4, 2011

(87) PCT Pub. No.: WO2011/036864

PCT Pub. Date: Mar. 31, 2011

(65) Prior Publication Data

US 2011/0214037 A1 Sep. 1, 2011

(30) Foreign Application Priority Data

Sep. 25, 2009 (JP) ................................ 2009-220707

(51) Int. Cl.
*H03M 13/00* (2006.01)

(52) U.S. Cl.
USPC .......................................... 714/777; 714/786

(58) Field of Classification Search
USPC ......................... 714/758, 774, 777, 786, 793
See application file for complete search history.

(56) References Cited

U.S. PATENT DOCUMENTS 5,930,272 A * 7/1999 Thesling ....................... 714/752
6,138,260 A 10/2000 Ketseoglou
6,694,477 B1 * 2/2004 Lee .............................. 714/784
8,201,047 B2 * 6/2012 Sakai et al. .................. 714/755

(Continued)

FOREIGN PATENT DOCUMENTS

CN 85103579 11/1986
JP 2007-288721 11/2007
JP 2008-205579 9/2008

OTHER PUBLICATIONS

Jianguang Zhao; Zarkeshvari, F.; Banihashemi, A.H.; , "On implementation of min-sum algorithm and its modifications for decoding low-density Parity-check (LDPC) codes," Communications, IEEE Transactions on , vol. 53, No. 4, pp. 549-554, Apr. 2005.*

(Continued)

*Primary Examiner* — Cynthia Britt
(74) *Attorney, Agent, or Firm* — Wenderoth, Lind & Ponack, L.L.P.

(57) ABSTRACT

Positions holding different bit values between a first code word, which is obtained by coding an information bit sequence based on a coding method utilizing quasi-cyclic codes, and a second code word, which has the close Hamming distance from the first code word and satisfies a parity check of the coding method, are identified. Thereafter, a code word is generated by inserting bit values known to the transmitter and receiver into the identified positions of the information bit sequence and coding the information bit sequence. Upon reception of a signal based on the generated code word, the receiver judges whether known bit values held by corresponding positions in a code word obtained by decoding the received signal are the same as preset bit values. If the judgment result is negative, the code word based on the received signal is judges as erroneous even when it satisfies the parity check.

10 Claims, 26 Drawing Sheets

(56) References Cited

U.S. PATENT DOCUMENTS

| | | | | |
|---|---|---|---|---|
| 2006/0036923 | A1 * | 2/2006 | Hedberg et al. | 714/752 |
| 2008/0198953 | A1 | 8/2008 | Yokokawa et al. | |
| 2008/0246639 | A1 * | 10/2008 | Sakai et al. | 341/107 |
| 2010/0037125 | A1 * | 2/2010 | Argon et al. | 714/800 |
| 2010/0223524 | A1 * | 9/2010 | Duggan et al. | 714/751 |
| 2010/0241923 | A1 * | 9/2010 | Wang et al. | 714/755 |
| 2011/0083065 | A1 * | 4/2011 | Singh et al. | 714/807 |

OTHER PUBLICATIONS

Miladinovic, N.; Fossorier, M.P.C.; , “Improved bit-flipping decoding of low-density parity-check codes,” Information Theory, IEEE Transactions on , vol. 51, No. 4, pp. 1594-1606, Apr. 2005.*

International Search Report issued Oct. 19, 2010 in International (PCT) Application No. PCT/JP2010/005700.

Satoshi Gounai et al., “Lowering the Error Floors of Irregular LDPC Code on Fast Fading Environment with Perfect and Imperfect CSIs”, IEICE Transactions on Communications, vol. E90-B, No. 3, pp. 569-577, Mar. 2007.

Xiao Dongliang et al., “A Perturbation Method for Decoding LDPC Concatenated with CRC”, Proceedings of the IEEE Wireless Communications and Networking Conference, pp. 667-671, Mar. 11, 2007.

Xiao-Yu Hu et al., “On the Computation of the Minimum Distance of Low-Density Parity-Check Codes”, IEEE Communications Society ICC2004, pp. 767-771, 2004.

IEEE Standard for Information technology—Telecommunications and information exchange between systems—Local and metropolitan area networks—Specific requirements, IEEE Computer Society, IEEE802. 11n Draft 2.0.

* cited by examiner

FIG. 1

$$Hb648 = \begin{bmatrix}
0 & - & - & - & 0 & 0 & - & - & 0 & 0 & 1 & - & - & - & - & - & - & - & - & - & - & - \\
22 & 0 & - & - & 17 & - & - & - & 12 & - & 0 & 0 & - & - & - & - & - & - & - & - & - & - \\
6 & - & 0 & - & 10 & - & 0 & - & 24 & - & - & 0 & 0 & - & - & - & - & - & - & - & - & - \\
2 & - & - & 0 & 20 & - & - & - & 25 & 0 & - & - & 0 & 0 & - & - & - & - & - & - & - & - \\
23 & - & - & - & 3 & - & - & 3 & 0 & - & - & - & - & 0 & 0 & - & - & - & - & - & - & - \\
24 & - & 23 & 1 & 17 & - & - & - & 10 & - & 9 & - & - & - & 0 & 0 & - & - & - & - & - & - \\
25 & - & - & - & 8 & - & 8 & - & 7 & 18 & - & - & - & - & - & 0 & 0 & - & - & - & - & - \\
13 & 24 & - & - & 0 & - & - & - & 6 & - & - & - & - & - & - & - & 0 & 0 & - & - & - & - \\
7 & 20 & - & 16 & 22 & 10 & - & - & 23 & - & - & 0 & - & - & - & - & - & 0 & 0 & - & - & - \\
11 & - & - & - & 19 & - & - & - & 13 & - & - & - & - & - & - & - & - & - & 0 & 0 & - & - \\
25 & - & - & - & 23 & 18 & 14 & - & 9 & - & 3 & - & - & - & - & - & - & - & - & 0 & 0 & - \\
3 & - & - & - & 16 & - & - & 2 & 25 & 5 & 17 & - & - & - & - & - & - & - & - & - & 0 & 0
\end{bmatrix}$$

Information bit portion | Parity bit portion

FIG. 2

| | | | Fourth column of Hb648 | | Tenth column of Hb648 | | Twelfth column of Hb648 |
|---|---|---|---|---|---|---|---|
| Code word No. 01 | : 0000 | · · · | 110000000000000000000000000 | · · · | 000000000000000001000000000 | · · · | 010000000000000000000000000 |
| Code word No. 02 | : 0000 | · · · | 011000000000000000000000000 | · · · | 000000000000000000100000000 | · · · | 001000000000000000000000000 |
| Code word No. 03 | : 0000 | · · · | 001100000000000000000000000 | · · · | 000000000000000000010000000 | · · · | 000100000000000000000000000 |
| Code word No. 04 | : 0000 | · · · | 000110000000000000000000000 | · · · | 000000000000000000001000000 | · · · | 000010000000000000000000000 |
| Code word No. 05 | : 0000 | · · · | 000011000000000000000000000 | · · · | 000000000000000000000100000 | · · · | 000001000000000000000000000 |
| Code word No. 06 | : 0000 | · · · | 000001100000000000000000000 | · · · | 000000000000000000000010000 | · · · | 000000100000000000000000000 |
| Code word No. 07 | : 0000 | · · · | 000000110000000000000000000 | · · · | 000000000000000000000001000 | · · · | 000000010000000000000000000 |
| Code word No. 08 | : 0000 | · · · | 000000011000000000000000000 | · · · | 000000000000000000000000100 | · · · | 000000001000000000000000000 |
| Code word No. 09 | : 0000 | · · · | 000000001100000000000000000 | · · · | 000000000000000000000000010 | · · · | 000000000100000000000000000 |
| Code word No. 10 | : 0000 | · · · | 000000000110000000000000000 | · · · | 000000000000000000000000001 | · · · | 000000000010000000000000000 |
| Code word No. 11 | : 0000 | · · · | 000000000011000000000000000 | · · · | 100000000000000000000000000 | · · · | 000000000001000000000000000 |
| Code word No. 12 | : 0000 | · · · | 000000000001100000000000000 | · · · | 010000000000000000000000000 | · · · | 000000000000100000000000000 |
| Code word No. 13 | : 0000 | · · · | 000000000000110000000000000 | · · · | 001000000000000000000000000 | · · · | 000000000000010000000000000 |
| Code word No. 14 | : 0000 | · · · | 000000000000011000000000000 | · · · | 000100000000000000000000000 | · · · | 000000000000001000000000000 |
| Code word No. 15 | : 0000 | · · · | 000000000000001100000000000 | · · · | 000010000000000000000000000 | · · · | 000000000000000100000000000 |
| Code word No. 16 | : 0000 | · · · | 000000000000000110000000000 | · · · | 000001000000000000000000000 | · · · | 000000000000000010000000000 |
| Code word No. 17 | : 0000 | · · · | 000000000000000011000000000 | · · · | 000000100000000000000000000 | · · · | 000000000000000001000000000 |
| Code word No. 18 | : 0000 | · · · | 000000000000000001100000000 | · · · | 000000010000000000000000000 | · · · | 000000000000000000100000000 |
| Code word No. 19 | : 0000 | · · · | 000000000000000000110000000 | · · · | 000000001000000000000000000 | · · · | 000000000000000000010000000 |
| Code word No. 20 | : 0000 | · · · | 000000000000000000011000000 | · · · | 000000000100000000000000000 | · · · | 000000000000000000001000000 |
| Code word No. 21 | : 0000 | · · · | 000000000000000000001100000 | · · · | 000000000010000000000000000 | · · · | 000000000000000000000100000 |
| Code word No. 22 | : 0000 | · · · | 000000000000000000000110000 | · · · | 000000000001000000000000000 | · · · | 000000000000000000000010000 |
| Code word No. 23 | : 0000 | · · · | 000000000000000000000011000 | · · · | 000000000000100000000000000 | · · · | 000000000000000000000001000 |
| Code word No. 24 | : 0000 | · · · | 000000000000000000000001100 | · · · | 000000000000010000000000000 | · · · | 000000000000000000000000100 |
| Code word No. 25 | : 0000 | · · · | 000000000000000000000000110 | · · · | 000000000000001000000000000 | · · · | 000000000000000000000000010 |
| Code word No. 26 | : 0000 | · · · | 000000000000000000000000011 | · · · | 000000000000000100000000000 | · · · | 000000000000000000000000001 |
| Code word No. 27 | : 0000 | · · · | 100000000000000000000000001 | · · · | 000000000000000010000000000 | · · · | 100000000000000000000000000 |

Fourth column of Hb648 | Tenth column of Hb648 | Twelfth column of Hb648

| Mode No. (801) | Codeword length (802) | Code rate (803) | False detection check bit insertion positions (804) | ... |
|---|---|---|---|---|
| 01 | 648 | 1/2 | 82, 84, 86, 88, 90, 92, 94, 96, 98, 100, 102, 104, 106, 108 | ... |
| 02 | 648 | 2/3 | . . . | ... |
| 03 | 648 | 3/4 | . . . | ... |
| 04 | 648 | 5/6 | . . . | ... |
| 05 | 1296 | 1/2 | . . . | ... |
| . . . | . . . | . . . | . . . | ... |

CODING DEVICE, DECODING DEVICE, CODING METHOD, DECODING METHOD, AND COMMUNICATION SYSTEM

CROSS-REFERENCE TO RELATED APPLICATION

The disclosures of Japanese Patent Application No. 2009-220707, filed on Sep. 25, 2009, including the specification, drawings and abstracts, are incorporated herein by reference in their entirety.

TECHNICAL FIELD

The present invention relates to coding performed with use of quasi-cyclic codes and corresponding decoding, and in particular to technology for preventing an erroneous code word from being judged as error-free. Such a wrong judgment is herein referred to as a false detection.

BACKGROUND ART

In communication systems such as a wireless LAN (Local Area Network) and PLC (Power Line Communication), when a transmitter device transmits data to a receiver device, an error occurs in the data received by the receiver device at a rate depending on the status of a channel. There are countermeasures against such an error that could occur in data upon transmission/reception of the data. One example of such countermeasures is a retransmission control method. According to this method, the receiver device checks whether the data it has received contains an error, and if the data contains an error, the data is retransmitted from the transmitter device. This way, error-free data will eventually be transmitted from the transmitter device to the receiver device.

This retransmission control method is described blow by taking an example of communication conforming to the communication standard IEEE (the Institute of Electrical and Electronics Engineers) 802.11n. FIG. 25 shows a PHY frame structure according to IEEE 802.11n. In a PHY frame shown in FIG. 25, a preamble signal composed of the following items is appended to the front of data to be transmitted (i.e., data carried by a DATA field in FIG. 25): an 8-μs L-STS (Legacy-Short Training Symbol); an 8-μs L-LTS (Legacy-Long Training Symbol); a 4-μs SIG (SIGnal field); an 8-μs H-SIG (High throughput-SIGnal field); a 4-μs HSTF (High throughput Short Training Field); and a 4-μs HLTF (High throughput Long Training Field) 1.

A preamble signal is used by the receiver device to perform time and frequency synchronization, AGC (Automatic Gain Control), and channel estimation. As a preamble signal contains information that is required to demodulate the DATA field, such as the length of data to be transmitted and the modulation/coding method for the data, the preamble signal is always appended at the front of a PHY frame. Furthermore, an error detection code called a CRC (Cyclic Redundancy Check) code is affixed to the data to be transmitted via the DATA field.

After the receiver device receives a PHY frame and performs predetermined signal processing, it transfers the received data to a MAC layer processing unit that performs predetermined processing in a MAC layer. The processing performed in the MAC layer includes an error detection using the CRC code appended to the received data. If the received data is judged as error-free as a result of the error detection, then the receiver device transmits, to the transmitter device, an acknowledgement response (ACK: ACKnowledge) indicating an error-free data reception. On the other hand, if the received data is judged as containing an error as a result of the error detection, then the receiver device does not transmit the ACK. When the transmitter device has not received the ACK corresponding to the PHY frame for a predetermined time period since the completion of transmission of the PHY frame, it judges that the data has not been properly received by the receiver device and accordingly retransmits the same data. Through the above procedures, the transmitter device repeatedly transmits the same data until the receiver device receives the data with no error. As a result, reliability of data transfer from the transmitter device to the receiver device can be improved.

Note that the retransmission control can also be achieved when the receiver device is configured to transmit a retransmission request, which is a signal for requesting retransmission of a data frame upon detection of an error, to the transmitter device. In this case, the transmitter device retransmits the data frame specified by the retransmission request upon receiving the retransmission request.

However, when a PHY frame is long, i.e., when the data size of a DATA field is large, the above-described error detection and retransmission control that are performed on a per-PHY frame basis are problematic as they cause reduction in the throughput. This is because the transmitter device would need to retransmit the long PHY frame in its entirety even when only part of the data received by the receiver device contains an error due to a local fluctuation of a wireless communication channel. Moreover, the longer a PHY frame is, the longer it takes to perform a single retransmission. Given this fact, when there are a plurality of terminals operating as transmitter devices or receiver devices, the throughput of the entire system is reduced.

As one method to solve this problem, a subblock retransmission method has been studied. The subblock retransmission method divides a DATA field into small blocks and performs the retransmission control on a per-subblock basis. The subblock retransmission method works as follows. When the receiver device receives a PHY frame, it performs an error detection on a per-subblock basis and requests the transmitter device to retransmit only the subblock(s) that contains an error. Upon receiving the retransmission request, the transmitter device configures a new PHY frame by appending a preamble to the specified subblock(s), and transmits the new PHY frame. This method only requires retransmission of the subblock(s) containing an error, instead of the entire PHY frame. Consequently, the throughput reduction caused by the retransmission can be alleviated to a great extent. This method also enables retransmission of data over a short period of time due to the small size of the data, thus preventing reduction in the throughput of the entire system.

Patent Literature 1 describes a decoding method utilizing the maximum a posteriori probability decoding. According to this decoding method, when decoding transmission words that include known bits holding known values, a decoded word candidate in which a known value in a part of a transmission word has been changed to another value is excluded from the decoded word candidates. In Patent Literature 1, a synchronization byte of an MPEG-2TS packet is used as a known bit by way of example.

CITATION LIST

Patent Literature

[Patent Literature 1]

JP Patent No. 4208017

[Non-Patent Literature]

[Non-Patent Literature 1]

Hu et al. "On the Computation of the Minimum Distance of Low-Density Parity Check codes." IEEE ICC2004.

[Non-Patent Literature 2]

IEEE 802.11n, Draft 2.0

SUMMARY OF INVENTION

Technical Problem

In order to apply the subblock retransmission method to a wireless communication system conforming to the IEEE 802.11n standard, it is possible to use code blocks of an LDPC (Low-Density Parity-Check) code, which is used as an error correction code, as subblocks. However, performing the retransmission control while using LDPC code blocks as subblocks must require detecting whether each LDPC code block contains an error.

Well-known as an error detection method, a CRC code is an error detection code that utilizes a cyclic code. The CRC code is widely used because of its high error detection accuracy and its ability to easily achieve coding/decoding processing with use of a shift register. However, in order to detect whether each LDPC code block contains an error with use of the CRC code, redundant bits must be appended to each LDPC code block for error detection purposes. This causes the problem of throughput reduction.

As one example of such a throughput reduction, the following describes the case where a 32-bit CRC code is used for an LDPC code block having a code length of 648 bits and a code rate of 1/2 as standardized in IEEE 802.11n. The LDPC code block having a code length of 648 bits and a code rate of 1/2 is made up of 324 information bits and 324 redundant bits. In order to apply a 32-bit CRC code to this LDPC code block, 32 bits out of 324 information bits must be used for redundant bits of the CRC code. In this case, a maximum of 292 information bits (324−32=292) can only be transmitted through one LDPC code block, and hence the throughput is reduced by 10% (32/324≈10%) compared to the case where all 324 bits are used as information bits.

Meanwhile, there is also a method for performing an error detection on the LDPC code block without appending error-detecting redundant bits. More specifically, this method utilizes a parity check of an LDPC code. An LDPC code is defined by a parity check matrix H. A code word c of the LDPC code always satisfies the parity check equation shown in the following Expression 1.

$$Hc=0 \quad \text{[Expression 1]}$$

An error detection utilizing a parity check takes advantage of the above relation to check whether an LDPC code block that has been subjected to processing of error-correction decoding in the receiver device satisfies the parity check equation Hc=0. If the LDPC code block satisfies the parity check equation, then the LDPC code block is judged as containing no error. If the LDPC code block does not satisfy the parity check equation, then the LDPC code block is judged as containing an error. As this method utilizes a parity check included the LDPC code, it is advantageous in that error-detecting redundant bits need not be appended and a throughput reduction is not caused.

However, the problem with the error detection method utilizing the parity check of the LDPC code is that, although the method can prevent a throughput reduction, the method also gives rise to a false detection whereby an LDPC code block that contains an error is judged as error-free at a rate of approximately $10^{-6}$ to $10^{-8}$. A description is now given of an error detection method utilizing a parity check of an LDPC code with reference to FIG. 26.

An LDPC decode unit 2610 performs LDPC decode processing on a received code word $c_r$ and outputs the resultant decoded code word $c_d$. A parity check unit 2620 checks whether the decoded code word $c_d$ is a code word of the LDPC code (this process is called a parity check). The parity check is performed by checking whether the decoded code word $c_d$ satisfies the following Expression 2 with use of the parity check matrix H of the LDPC code.

$$Hc_d=0 \quad \text{[Expression 2]}$$

The LDPC decode unit 2610 generally performs LDPC decode processing using MAP decoding, such as sum-product decoding, or quasi-MAP decoding. The MAP decoding and quasi-MAP decoding are performed based on an algorithm that brings about a maximum a posteriori probability for each bit constituting a code word. Therefore, a code word obtained as a result of the decoding is not necessarily a code word of the LDPC code. When the decoded code word $c_d$ is not a code word of the LDPC code, that is, when the decoded code word $c_d$ does not satisfy the above Expression 2, inaccuracy of this decoding result can be detected.

On the other hand, when the decoded code word $c_d$ is a code word of the LDPC code, that is, when the decoded code word $c_d$ satisfies the above Expression 2, there is a possibility that the decoded code word $c_d$ is an error-free code. Note that the decoded code word $c_d$ being an error-free code means that the decoded code word $c_d$, which is obtained through the decoding performed by the receiver device, is the same as the code word transmitted by the transmitter device. Also note that the decoded code word $c_d$ being a code word of the LDPC code means that the decoded code word $c_d$ satisfies the parity check of the LDPC code, i.e., the decoded code word $c_d$ is judged as an error-free code word in the parity check.

However, the decoded code word $c_d$ being a code word of the LDPC code is not equal to the decoded code word $c_d$ being an error-free code word. This is because, provided that the number of information bits in an LDPC code block is k, there are $2^k$ code words of the LDPC code, and the parity check only allows checking whether the decoded code word $c_d$ matches any of the $2^k$ code words. Therefore, when an error detection utilizing the parity check is performed only by itself, a code word that is both (i) a code word of the LDPC code and (ii) an erroneous code word may be judged as containing no error. This is the reason for the above-mentioned low detection accuracy.

The following describes a rate at which a false detection takes place. Table 1 shows a block error rate and a false detection rate obtained by a computer simulation for an LDPC code having a code length of 648 bits and a code rate of 1/2 as standardized in IEEE 802.11n, in correspondence with Eb/N0 (dB) in an AWGN (Additive White Gaussian Noise) communication channel. The block error rate denotes a rate at which a code word that has been subjected to LDPC decoding (LDPC code block) contains an error. The false detection rate denotes a rate of occurrence of an event where the code word that has been subjected to LDPC decoding satisfies the parity check but is not an error-free code word. It is apparent from Table 1 that, with respect to Eb/N0 corresponding to a block error rate of $10^{-4}$ or less, a false detection takes place at a rate of approximately $10^{-6}$ to $10^{-7}$.

TABLE 1

| Eb/N0 (dB) | Block Error Rate | False Detection Rate |
|---|---|---|
| 2 | 1.3199E−02 | 1.4248929E−05 |
| 2.5 | 6.1278E−04 | 3.7118917E−06 |
| 3 | 2.5790E−05 | 6.1274873E−07 |
| 3.5 | 1.5200E−06 | 1.0000021E−07 |

The present invention has been made to solve the above problem associated with an error detection method utilizing the parity check. The present invention aims to provide (i) a coding device and a coding method capable of generating a code word that can reduce a rate of false detection whereby an erroneous code word is judged as an error-free code word with use of a parity check of an LDPC code, and (ii) a decoding device and a decoding method capable of receiving and decoding the code word generated by these coding device and coding method.

Solution to Problem

In order to solve the above problem, a coding device pertaining to the present invention is for coding an information bit sequence and outputting the coded information bit sequence, and comprises: a determining unit operable to, in accordance with an applied coding method that utilizes a quasi-cyclic code, determine at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; an inserting unit operable to generate a pre-coding bit sequence by inserting the predetermined bit value into the insertion position of the information bit sequence; and a coding unit operable to generate a third code word by coding the pre-coding bit sequence in accordance with the coding method.

Also, a coding method pertaining to the present invention is for coding an information bit sequence, comprising the steps of: (A) determining, in accordance with an applied coding method that utilizes a quasi-cyclic code, at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; (B) generating a pre-coding bit sequence by inserting the predetermined bit value into the insertion position of the information bit sequence; and (C) generating a third code word by coding the pre-coding bit sequence in accordance with the coding method.

Also, a decoding device pertaining to the present invention comprises: a decoding unit operable to generate a decoded bit sequence by performing decode processing on a pre-decoding bit sequence input thereto, the decode processing complying with an applied coding method that utilizes a quasi-cyclic code; a checking unit operable to check whether the decoded bit sequence is judged as an error-free code word by a parity check of the coding method; a judging unit operable to judge whether at least one insertion position in the decoded bit sequence holds at least one predetermined bit value, wherein according to the coding method, a bit position in a first code word which corresponds to the insertion position is predetermined to hold a different bit value from a bit position in a second code word which corresponds to the insertion position, the first code word being generated by a transmitter device according to the coding method, and the second code word being judged as an error-free code word by the parity check but being different from the first code word by the minimum Hamming distance; and an error detecting unit operable to, in a case where the judging unit judges in the negative, judge that the decoded bit sequent is erroneous even when a result of the checking by the checking unit shows that the decoded bit sequence has been judged as the error-free code word by the parity check.

Also, a decoding method pertaining to the present invention comprises the steps of: (A) generating a code word by decoding a received signal in accordance with an applied coding method that utilizes a quasi-cyclic code; (B) checking whether the code word generated in the step (A) is an error-free code word by a parity check of the coding method; (C) judging whether at least one insertion position in the generated code word holds at least one predetermined bit value, wherein according to the coding method, a bit position in a first code word which corresponds to the insertion position is predetermined to hold a different bit value from a bit position in a second code word which corresponds to the insertion position, the first code word being generated by a transmitter device according to the coding method, and the second code word being judged as an error-free code word by the parity check but being different from the first code word by the minimum Hamming distance; and (D) in a case where the judgment in the step (C) is in the negative, judging that the generated code word is erroneous even when a result of the checking by the step (B) shows that the generated code word has been judged as the error-free code word by the parity check.

Also, a communication system pertaining to the present invention includes a transmitter device and a receiver device. The transmitter device, which codes an information bit sequence and transmits the coded information bit sequence, comprises: a determining unit operable to, in accordance with an applied coding method that utilizes a quasi-cyclic code, determine at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; an inserting unit operable to generate a pre-coding bit sequence by inserting the predetermined bit value into the insertion position of the information bit sequence; a coding unit operable to generate a third code word by coding the pre-coding bit sequence in accordance with the coding method; and a transmitting unit operable to transmit a wireless signal containing the third code word. The receiver device comprises: a receiving unit operable to receive the wireless signal; a decoding unit operable to generate a code word by decoding the received signal in accordance with the coding method; a checking unit operable to check whether the code word generated by the decoding unit is judged as an error-free code word by the parity check of the coding method; a judging unit operable to judge whether at least one insertion position in the generated code word holds at least one predetermined bit value, wherein according to the coding method, a bit position in a first code word which corresponds to the insertion position is predetermined to hold a different bit value from a bit position in a second code word which corresponds to the insertion position, the first code word being generated by the transmitter device according to the coding method, and the second code word being judged as an error-free code word by the parity check but being different from the first code word by the minimum Hamming distance; and an error detecting unit operable to, in a case where the judging unit judges in the negative, judge that the generated code word is erroneous even when a result of the checking by the checking unit shows that the generated code word has been judged as the error-free code word by the parity check.

Advantageous Effects of Invention

The above structure enables the coding device to, in accordance with an applied coding method that utilizes quasi-cyclic codes, determine insertion positions of an information bit sequence into which known bits are to be inserted. After the known bits are inserted into the insertion positions, the encoding can be performed. These insertion positions hold different bit values between (i) a code word obtained by coding the information bit sequence to be transmitted as-is, and (ii) a code word that is different from the code word (i) by the minimum Hamming distance but is judged as an error-free code word by a parity check of the applied coding method. Hence, by inserting bit values that are known to the transmitter device and the receiver device into these insertion positions, the receiver device can detect an error in a signal it has received if a decoded code word, which is obtained by decoding the received signal, is different from the original code word transmitted by the transmitter device by the minimum Hamming distance, even when the decoded code word has changed from the original code word but has been judged as an error-free code word by the parity check of the applied coding method. This can reduce the rate at which a code word that is different from the original code word is falsely judged as an error-free code word.

BRIEF DESCRIPTION OF DRAWINGS

FIG. 1 shows one example of a parity check matrix pertaining to Embodiment 1.

FIG. 2 shows code words that are different from an all-zero code word by the minimum Hamming distance.

FIG. 3 is a conceptual diagram showing insertion positions of a code word into which false detection check bits are to be inserted.

FIG. 8 shows an insertion position determination table associated with each coding mode.

FIGS. 12A-1 to 12B-4 are conceptual diagrams relating to insertion of shortening bits pertaining to Embodiment 2.

DESCRIPTION OF EMBODIMENTS

Figure 4:
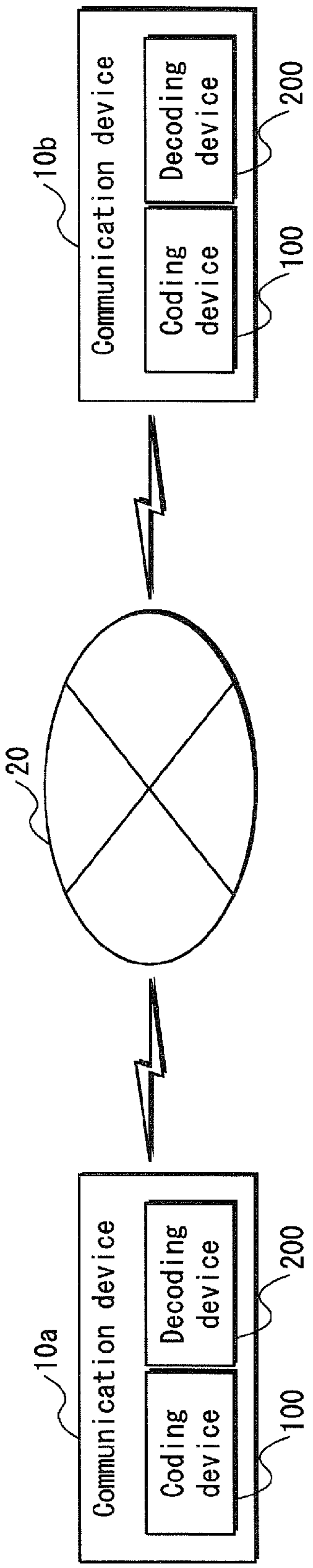
FIG. 4 shows a system structure of a communication system pertaining to Embodiment 1.

One aspect of the present invention is a first coding device for coding an information bit sequence and outputting the coded information bit sequence, comprising: a determining unit operable to, in accordance with an applied coding method that utilizes a quasi-cyclic code, determine at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; an inserting unit operable to generate a pre-coding bit sequence by inserting the predetermined bit value into the insertion position of the information bit sequence; and a coding unit operable to generate a third code word by coding the pre-coding bit sequence in accordance with the coding method.

Another aspect of the present invention is a first decoding device comprising: a decoding unit operable to generate a decoded bit sequence by performing decode processing on a pre-decoding bit sequence input thereto, the decode processing complying with an applied coding method that utilizes a quasi-cyclic code; a checking unit operable to check whether the decoded bit sequence is judged as an error-free code word by a parity check of the coding method; a judging unit operable to judge whether at least one insertion position in the decoded bit sequence holds at least one predetermined bit value, wherein according to the coding method, a bit position in a first code word which corresponds to the insertion position is predetermined to hold a different bit value from a bit position in a second code word which corresponds to the insertion position, the first code word being generated by a transmitter device according to the coding method, and the second code word being judged as an error-free code word by the parity check but being different from the first code word by the minimum Hamming distance; and an error detecting unit operable to, in a case where the judging unit judges in the negative, judge that the decoded bit sequent is erroneous even when a result of the checking by the checking unit shows that the decoded bit sequence has been judged as the error-free code word by the parity check.

Yet another aspect of the present invention is a coding method for coding an information bit sequence, comprising the steps of: (A) determining, in accordance with an applied coding method that utilizes a quasi-cyclic code, at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; (B) generating a pre-coding bit sequence by inserting the predetermined bit value into the insertion position of the information bit sequence; and (C) generating a third code word by coding the pre-coding bit sequence in accordance with the coding method.

Yet another aspect of the present invention is a decoding method comprising the steps of: (A) generating a code word by decoding a received signal in accordance with an applied coding method that utilizes a quasi-cyclic code; (B) checking whether the code word generated in the step (A) is an error-free code word by a parity check of the coding method; (C) judging whether at least one insertion position in the generated code word holds at least one predetermined bit value, wherein according to the coding method, a bit position in a first code word which corresponds to the insertion position is predetermined to hold a different bit value from a bit position in a second code word which corresponds to the insertion position, the first code word being generated by a transmitter device according to the coding method, and the second code word being judged as an error-free code word by the parity check but being different from the first code word by the minimum Hamming distance; and (D) in a case where the judgment in the step (C) is in the negative, judging that the generated code word is erroneous even when a result of the checking by the step (B) shows that the generated code word has been judged as the error-free code word by the parity check.

Yet another aspect of the present invention is a communication system including a transmitter device and a receiver device. The transmitter device, which codes an information bit sequence and transmits the coded information bit sequence, comprises: a determining unit operable to, in accordance with an applied coding method that utilizes a quasi-cyclic code, determine at least one bit position in the information bit sequence as an insertion position into which a predetermined bit value is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method but being different from the first code word by the minimum Hamming distance; an inserting unit operable to generate a pre-coding bit sequence by inserting the predetermined bit value into the insertion position of the information bit sequence; a coding unit operable to generate a third code word by coding the pre-coding bit sequence in accordance with the coding method; and a transmitting unit operable to transmit a wireless signal containing the third code word. The receiver device comprises: a receiving unit operable to receive the wireless signal; a decoding unit operable to generate a code word by decoding the received signal in accordance with the coding method; a checking unit operable to check whether the code word generated by the decoding unit is judged as an error-free code word by the parity check of the coding method; a judging unit operable to judge whether at least one insertion position in the generated code word holds at least one predetermined bit value, wherein according to the coding method, a bit position in a first code word which corresponds to the insertion position is predetermined to hold a different bit value from a bit position in a second code word which corresponds to the insertion position, the first code word being generated by the transmitter device according to the coding method, and the second code word being judged as an error-free code word by the parity check but being different from the first code word by the minimum Hamming distance; and an error detecting unit operable to, in a case where the judging unit judges in the negative, judge that the generated code word is erroneous even when a result of the checking by the checking unit shows that the generated code word has been judged as the error-free code word by the parity check.

The above first coding device performs coding after inserting predetermined bit values into positions that hold different values between (i) a code word generated in accordance with an applied coding method that utilizes quasi-cyclic codes and (ii) a code word that is judged as an error-free code word by a parity check of the coding method but is different from the generated code word by the minimum Hamming distance. A code word coded in the above manner enables the receiver device to detect an erroneous code word that is judged as an error-free code word by the parity check by checking the inserted bits different from predetermined bits.

Yet another aspect of the present invention is a second coding device, which is the first coding device further comprising a known bit appending unit operable to append at least one known bit, which has been predetermined as a shortening bit of a shortening code, to the information bit sequence when an information length of the information bit sequence is shorter than an information length of an information bit portion of a code word determined based on a codeword length and a code rate pertaining to the coding method, wherein the inserting unit rearranges the information bit sequence to which the known bit has been appended, so that the known bit is inserted into the insertion position as the predetermined bit value.

Yet another aspect of the present invention is a second decoding device, which is the first decoding device further comprising an inserting unit operable to, when a pre-decoding shortened code word from which one or more of the at least one predetermined bit value have been removed by the transmitter device is input thereto, generate the pre-decoding bit sequence by inserting at least one known bit holding a known value into the input pre-decoding shortened code word.

The above second coding device inserts known bits that have been originally determined to be appended in order to adjust the information length of an LDPC code block. This can suppress reduction in the throughput of data transfer caused by the first coding device inserting predetermined bits.

Yet another aspect of the present invention is a third coding device, which is the first coding device further comprising a removing unit operable to remove one or more of the at least one known bit appended by the known bit appending unit from the third code word.

The above third coding device can reduce the size of information to be transmitted by removing known bits. This way, the throughput of data transfer can be increased.

Yet another aspect of the present invention is a fourth coding device, which is the first coding device wherein the third code word generated by the coding unit includes a block ID for identifying the third code word among other third code words, and the inserting unit inserts a bit value of a bit representing the block ID into the insertion position as the predetermined bit value.

Yet another aspect of the present invention is a third decoding device, which is the first decoding device wherein the judging unit judges whether the insertion position in the decoded bit sequence holds a bit value that can be predicted from a predetermined bit value of another decoded bit sequence, instead of judging whether the insertion position in the decoded bit sequence holds the at least one predetermined bit value.

The above fourth coding device uses, as known bits to be inserted, block IDs that have been originally determined to be appended and that determine the order of code words. This can suppress reduction in the throughput of data transfer caused by the first coding device inserting predetermined bits.

The above third decoding device can detect whether a target block ID is erroneous based on a block ID obtained from a previous or next code block. This improves the rate of false detection whereby an erroneous code word is judged as error-free.

[Embodiment 1]

The following describes one embodiment of a coding device and a decoding device pertaining to the present invention with reference to the drawings.

<Concepts>

Prior to explaining a coding device and a decoding device pertaining to the present invention, concepts of the present invention are first described below.

As has been exhibited in the above Technical Problem section, a coding device and a decoding device pertaining to the present embodiment increase the rate of prevention of false detection whereby an erroneous code word that satisfies a parity check is judged as an error-free code word as a result of an error detection.

As mentioned above, in a case where a sufficient SNR (Signal-to-Noise Ratio) is preserved in the communication channel, the rate at which the decoded code word $c_d$ becomes both a code word of the LDPC code and an erroneous code word is approximately $10^{-6}$ to $10^{-8}$. Note that this rate varies depending on the parity check matrix H defining the LDPC code.

Below is a discussion on a decoded code word that contains an error but is mistakenly judged by the decoding device as an error-free code word. More specifically, the following discussion focuses on how likely it is for the decoded code word $c_d$, which is a code word of the LDPC code but is an erroneous code word, to be judged as one of $(2^k-1)$ code words that are code words of the LDPC code but are erroneous code words. The decoded code word $c_d$ is obtained by performing LDPC decoding on a received code word $c_r$. The received code word $c_r$ is obtained by the receiver device receiving a signal generated based on a corresponding error-free code word. Provided that a sufficient SNR is preserved during communication, even if the corresponding error-free code word changes during communication, the amount of such a change in the corresponding error-free code word is considered minimum. More specifically, when the decoded code word $c_d$ is a code word of the LDPC code but is an erroneous code word, there is a high possibility that the decoded code word $c_d$ is close to the corresponding error-free code word in terms of the Hamming distance. Especially, there is an extremely high possibility that the decoded code word $c_d$ is a code word that is different from the corresponding error-free code word by the minimum Hamming distance (hereinafter referred to as a "minimum-distance code word"). Therefore, by checking whether the decoded code word $c_d$ is the minimum-distance code word in relation to the corresponding error-free code word in addition to performing the conventional parity check, the error detection accuracy can be improved to a practically sufficient level. Note that the operation of "checking whether or the decoded code word $c_d$ is the minimum-distance code word" is herein referred to as a minimum-distance code word check. In the present Description, the minimum-distance code word denotes a code word that is different from the corresponding error-free code word by a Hamming distance of one or more.

The following describes the minimum-distance code word check by taking one specific example.

In the following description of the minimum-distance code word check, an LDPC code having a code length of 648 bits and a code rate of 1/2 as standardized in IEEE 802.11n is used as an example.

Figures 1, 2, 3, 4, 12A, 12B:
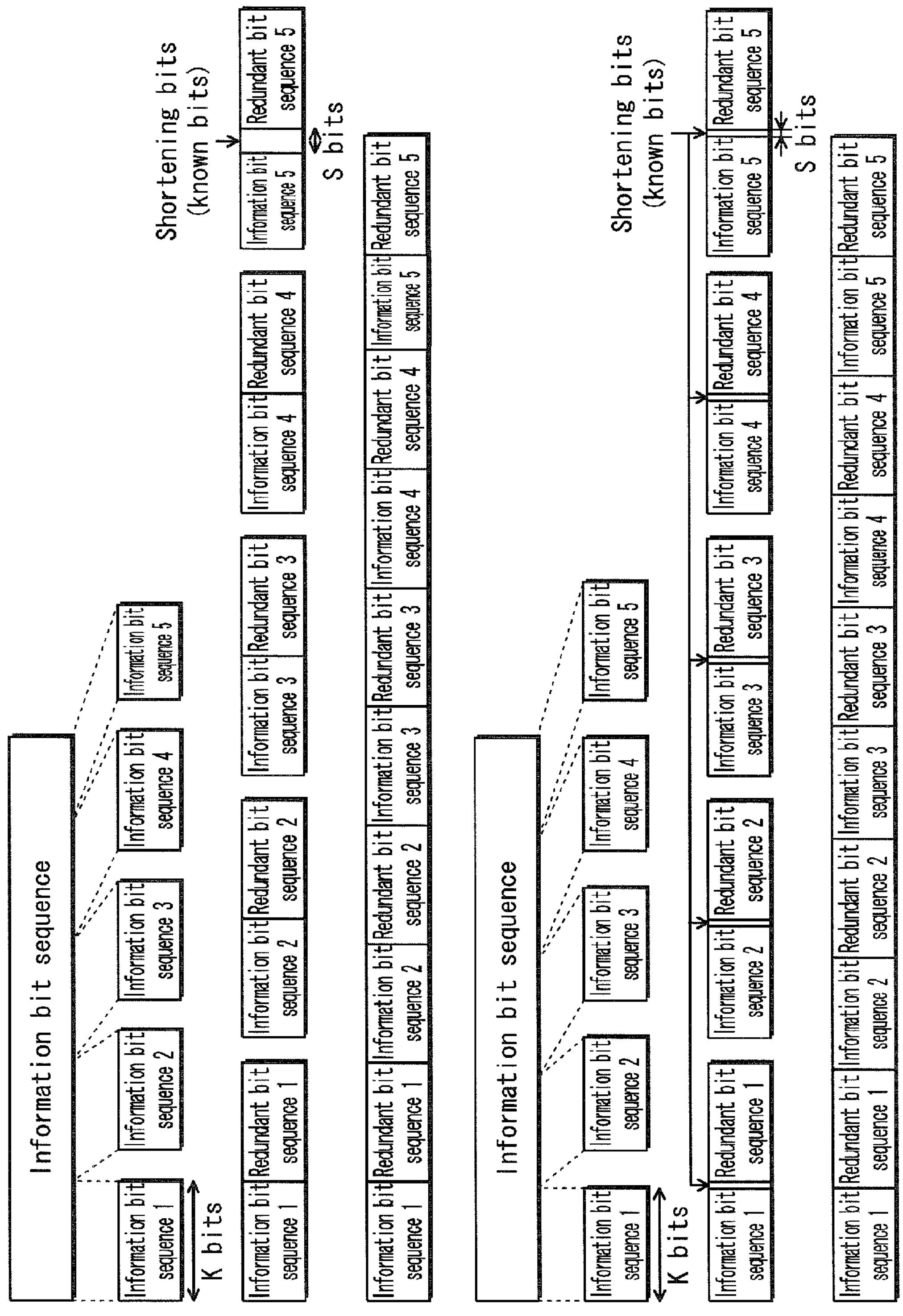

FIG. 1 shows a parity check matrix Hb648 of an LDPC code having a code length of 648 bits and a code rate of 1/2 as standardized in IEEE 802.11n. The parity check matrix Hb648 shown in FIG. 1 is a 12×24 matrix.

Of all the entries in Hb648, a dash "-" indicates a 27×27 zero matrix.

Also, of all the entries in Hb648, each entry expressed by an integer p (where $0 \leq p$) indicates a matrix obtained by performing a rightward cyclic shift of a 27×27 identity matrix p times. For example, an entry expressed by p having a value 0 is a 27×27 identity matrix, and an entry expressed by p having a value 22 is a matrix obtained by performing a rightward cyclic shift of the 27×27 identity matrix 22 times.

The parity check matrix Hb648 is made up of the above-described entries. When expanded, the parity check matrix Hb648 is actually a 324×648 matrix (defined herein as Hf648).

Columns of Hf648 correspond to 648 bits constituting a code word, respectively. The 1st to 324th columns make an information bit portion corresponding to information bits, whereas the 325th to 648th columns make a parity bit portion. In addition, each row of Hf648 corresponds to a parity check equation. In each row, a summation of bits belonging to any column showing an entry with a value 1 (i.e., a result of performing an exclusive or operation on such bits) is 0. An LDPC code defined by Hb648 is referred to as a quasi-cyclic LDPC (Quasi-Cyclic Low-Density Parity-Check) code.

By using the minimum distance retrieval method disclosed in Non-Patent Literature 1, the following can be retrieved: (i) the minimum Hamming distance between an original error-free code word and a corresponding erroneous code word of the LDPC code defined by Hb648 is 15; and (ii) there are 27 minimum-distance code words. The minimum distance being 15 means that, between an original error-free code word and a corresponding minimum-distance code word, 15 bits out of 648 bits show different values, whereas the remaining 633 bits show the same values. For simplicity, the following description is provided under the assumption that an error-free code word is a 648-bit all-zero code word. The 648-bit all-zero code word satisfies Hc=0 and therefore is a code word of Hb648. It should be mentioned that as an LDPC code is a linear code, generality of the following description would not be lost even when the error-free code word is other than the all-zero code word.

FIG. 2 shows a list of information bit portions of the 27 minimum-distance code words. Between the all-zero code word and each minimum-distance code word, 15 bits are different—i.e., there is a Hamming distance of 15 therebetween. However, as for the information bit portion of each minimum-distance code word, 4 bits out of the entire 324 bits are different. It can be seen from FIG. 2 that the 27 minimum-distance code words have relevance to one another. By "relevance" it means that the 4 bits different from their counterparts in the corresponding error-free code word (in this example, the all-zero code word) are distributed as follows: of the 4 bits, 2 bits are in the 4th column, 1 bit is in the 10th column, and 1 bit is in the 12th column of Hb648 as shown in FIG. 2.

Furthermore, when the identity matrix is expanded, each of the 27 minimum-distance code words has the following bit arrangement: provided n=1 to 27, values of the nth and (n+1)%27th bits in the 4th column, the (n+17)%27th bit in the 10th column, and the (n+1)%27th bit in the 12th column of Hb648 are different from their counterparts in the corresponding error-free code word. The above relevance arises from the following reason. Since an LDPC code conforming to IEEE 802.11n shown in FIG. 2 is a quasi-cyclic code (QC-LDPC code), a bit sequence obtained by cycling a given code word in units of the identity matrix size (i.e., in units of 27 bits) is also a code word, and the Hamming weight thereof remains unchanged. Note that the symbol "%" used herein denotes a modulo operation.

The following describes a method of detecting whether the decoded code word $c_d$ satisfying the parity check equation is a minimum-distance code word with n=1 (i.e., a code word that is different from a corresponding error-free code word in values of the 82nd, 83rd, 261st and 299th bits in the information bit portion thereof) by taking advantage of the above-described relevance between the error-free code word and each of the 27 minimum-distance code words.

The transmitter device generates an error-free code word including at least one known bit (i.e., a bit holding a known value), the stated at least one bit corresponding to one of four bits that are included in a corresponding minimum-distance code word with n=1 and hold different values from their counterparts in the error-free code word. It should be noted that information indicating which bit is set as a known bit and information indicating what value is held by the known bit are shared between the transmitter device and the receiver device ahead of time. With such a known bit inserted in the information bit sequence, the receiver device can judge that the decoded code word $c_d$ is not a minimum-distance code word with n=1 when the value of the known bit in the decoded code word $c_d$ is the same as the known value preset by the transmitter device. On the other hand, when the value of the known bit in the decoded code word $c_d$ is different from the known value preset by the transmitter device, the receiver device can judge that there is a possibility that the decoded code word $c_d$ is at least not an error-free code word but is a minimum-distance code word with n=1.

The receiver device judges the decoded code word $c_d$ as containing no error only in a case where the decoded code word $c_d$ satisfies the parity check and its known bit holds a known value. In other cases, the receiver device judges the decoded code word $c_d$ as containing an error. This makes it possible to eliminate the possibility of false detection whereby the decoded code word $c_d$ that is a minimum-distance code word with n=1 is judged as containing no error.

The same goes for other minimum-distance code words with n=2 to 27. That is, out of four bits of each minimum-distance code word that hold different values from their counterparts in the corresponding error-free code word, at least one bit is set as a known bit. This makes it possible to eliminate the possibility of false detection whereby the decoded code word $c_d$ that is one of the minimum-distance code words with n=1 to 27 is judged as containing no error. To be more specific, the receiver device should be configured as follows. The receiver device judges the decoded code word $c_d$ as containing no error only in a case the following conditions are both satisfied: (i) the decoded code word $c_d$ satisfies the parity check; and (ii) all known bits in the decoded code word $c_d$ hold known values preset by the transmitter device. The receiver device judges the decoded code word $c_d$ as containing an error in any other case.

As set forth above, in an information bit portion of every minimum-distance code word, at least one bit out of all bits holding different values from their counterparts in a corresponding error-free code word is preset as a known bit. This way, when the decoded code word $c_d$ is not an error-free code word but is a minimum-distance code word, the receiver device is prevented from making a false detection whereby the decoded code word $c_d$ is judged as containing no error. Hereinafter, a known bit that holds a known value for the purpose of avoiding the above-described false detection is referred to as a false detection check bit.

In the case of an LDPC code conforming to the IEEE 802.11n standard with a codeword length of 648 bits and a code rate of 1/2, the 4th column in the parity check matrix Hb648 includes bits holding different values between an error-free code word and a corresponding minimum-distance code word. Hence, by setting one bit that is in a position corresponding to the fourth column of the parity check matrix Hb648 as a known bit, two minimum-distance code words can be detected at once.

Therefore, as shown in FIG. 3, in the case of an LDPC code conforming to IEEE 802.11n with a codeword length of 648 bits and a code rate of 1/2, the 14 bits corresponding to odd-numbered columns out of all the 27 columns shown in the $4^{th}$ column of the parity check matrix Hb648 are set as known bits x. This arrangement allows checking whether the decoded code word $c_d$ is a minimum-distance code word, no matter which one of the 27 minimum-distance code words the decoded code word $c_d$ represents. Note that a false detection check bit x may hold any value as long as that value is known to the transmitter device and the receiver device, i.e., as long as that value is shared between the transmitter device and the receiver device ahead of time.

In the present example, all 27 code words having the minimum Hamming distance can be excluded by setting the 14 bits corresponding to the odd-numbered columns out of all the 27 columns shown in the $4^{th}$ column of Hb648 as false detection check bits. However, as long as at least one of these 14 bits is set as a false detection check bit, it is possible to eliminate the possibility of falsely detect at least two code words having small Hamming distances as error-free code words, and therefore to reduce the rate of false detection. Hence, in order to increase the throughput of information transmission, only part of these 14 bits may be set as a known bit(s). Meanwhile, by setting at least one bit in columns other than the $4^{th}$ column of Hb648 (i.e., in the $10^{th}$ and $12^{th}$ columns) as a false detection check bit (i.e., known bit), it is possible to eliminate the possibility of falsely detecting at least one code word having the small Hamming distance as an error-free code word.

<Structure>

A description is now given of a transmitter device and a receiver device that can prevent the above-described false detection.

FIG. 4 shows an example of a system structure of a communication system that uses a coding device and a decoding device. The communication system includes communication devices 10*a* and 10*b* that each function as a transmitter device or a receiver device. The communication devices 10*a* and 10*b* perform communication via a network 20. Each of the communication devices 10*a* and 10*b* includes a coding device 100 and a decoding device 200.

As shown in FIG. 4, in the communication system, a plurality of communication devices are connected with one another via the network. Each one of the communication device includes a coding device and a decoding device. Examples of a communication device include a cell phone and a base station device.

A communication device transmits information to another communication device after performing the coding processing shown in the present embodiment (the specifics are described later). The stated another communication device receives a transmitted signal and performs the decode processing shown in the present embodiment (the specifics are described later).

In the present Description, the communication processing that does not involve the coding processing and the LDPC decoding performed by communication devices (for example, AGC, ADC (Analog-to-Digital Convert), DAC (Digital-to-Analog Convert), FFT (Fast Fourier Transform), IFFT (Inverse Fast Fourier Transform), and quadrature detection) is performed according to conventional methods. Hence, the details of such processing are omitted. It goes without saying that each communication device, as the name suggests, includes other circuits for signal transmission/reception. The details of such circuits are omitted as well.

Figure 5:
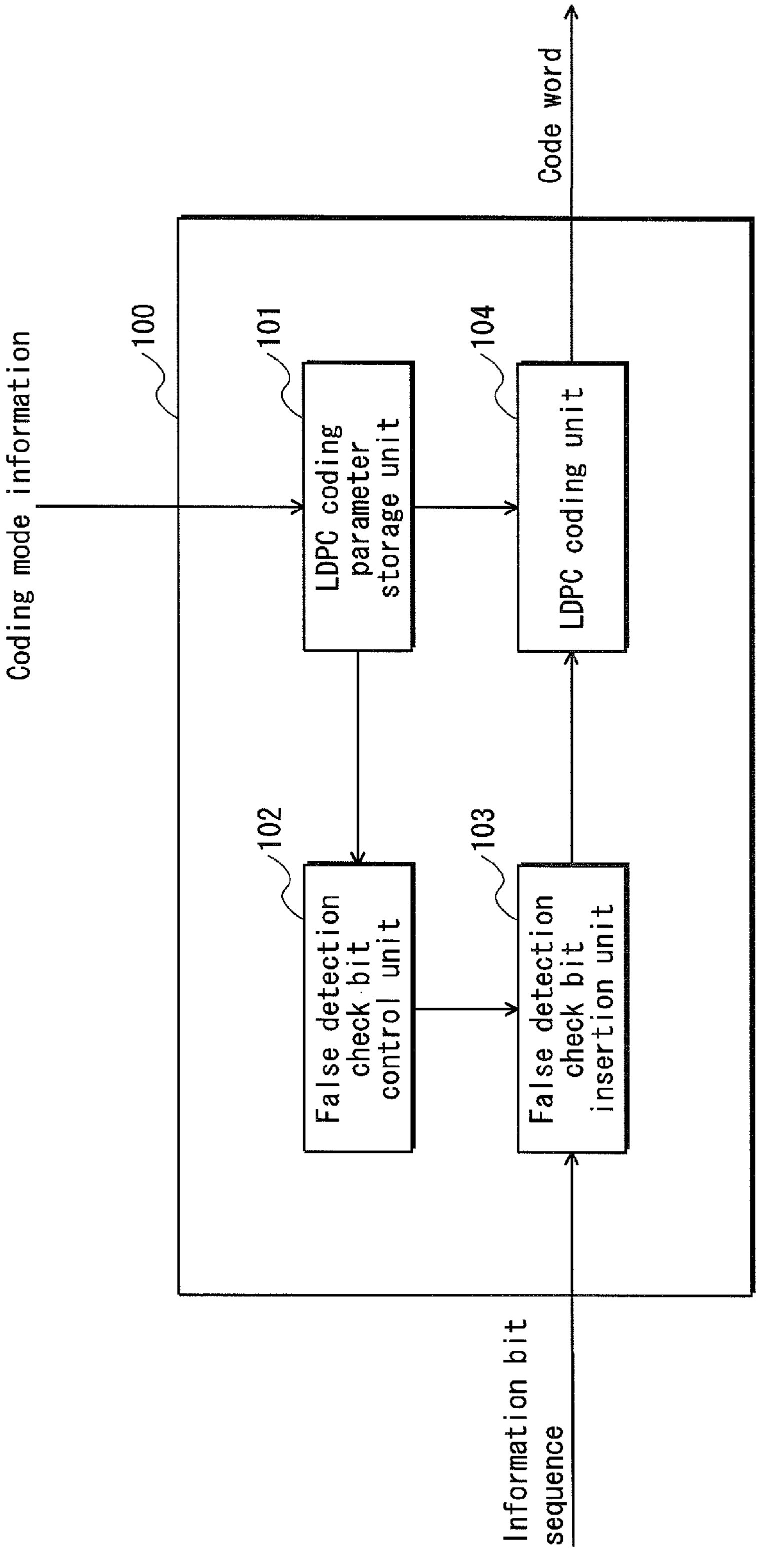
FIG. 5 is a functional block diagram showing a functional structure of a coding device included in a communication device pertaining to Embodiment 1.

FIG. 5 is a functional block diagram showing the functional structure of the coding device included in each communication device.

As shown in FIG. 5, the coding device 100 includes an LDPC coding parameter storage unit 101, a false detection check bit control unit 102, a false detection check bit insertion unit 103, and an LDPC coding unit 104.

The LDPC coding parameter storage unit 101 has the function of storing various types of parameters required for the LDPC coding in accordance with coding mode with which the LDPC coding is to be performed, as well as the function of notifying such coding mode with which the LDPC coding is to be performed to the false detection check bit control unit 102 and the LDPC coding unit 104. Coding mode is determined based on the codeword length and code rate. In the case of IEEE 802.11n, three types of codeword lengths are defined, namely 648 bits, 1296 bits, and 1944 bits, and four types of code rates are defined, namely 1/2, 2/3, 3/4, and 5/6. That is to say, there is a total of 12 coding modes. Each communication device selects one of the three types of codeword lengths and one of the four types of code rates. The coding device therein performs the coding in accordance with the selected codeword length and code rate. The various types of parameters include, for example, a codeword length N, an information bit length K, a redundant bit length M, a parity check matrix H, the number D of false detection check bit, false detection check bit insertion positions p, etc. It should be noted that a transmitter device includes information indicating one or more of the above parameters (hereinafter referred to as coding mode information) into SIG and H-SIG, which are transmitted as the preamble signal of the above-described PHY frame. This way, the receiver device can analyze the SIG and H-SIG to obtain the coding mode.

The LDPC coding parameter storage unit 101 identifies the coding mode with which the coding is to be performed in accordance with the coding mode information specified by the CPU or the like of the communication device, by using an insertion position determination table that defines false detection check bit insertion positions, which are one of the aforementioned various parameters (the details of the table are described later). Then, the LDPC coding parameter storage unit 101 notifies information relating to the specified coding mode to the false detection check bit control unit 102 and the LDPC coding unit 104. The LDPC coding parameter storage unit 101 notifies the false detection check bit control unit 102 of the number of false detection check bits to be inserted as well as insertion positions of the false detection check bits. The LDPC coding parameter storage unit 101 also notifies the LDPC coding unit 104 of a parity check matrix H to be used.

The false detection check bit control unit 102 generates the necessary number of false detection check bits based on the information notified by the LDPC coding parameter storage unit 101. Note that the false detection check bits may hold any values as long as the values are known to both of the transmitter device and the receiver device. For simplicity, the following description will be given assuming that all the false detection check bits hold a value 0. The false detection check bit control unit 102 notifies the false detection check bit insertion unit 103 of the false detection check bit insertion positions p of the corresponding coding mode, together with the generated false detection check bits.

The false detection check bit insertion unit 103 generates a pre-coding bit sequence by inserting, into the false detection check bit insertion positions specified by the false detection check bit control unit 102, the false detection check bits that have been notified by the false detection check bit control unit 102 as holding predetermined bit values. Then, the false detection check bit insertion unit 103 transfers the generated pre-coding bit sequence to the LDPC coding unit 104.

The LDPC coding unit 104 has the function of (i) generating a code word by executing the LDPC coding processing on the information bit sequence into which the false detection check bits have been inserted—i.e., the pre-coding bit sequence transferred from the false detection check bit insertion unit 103—according to the parity check matrix H notified by the LDPC coding parameter storage unit 101, and (ii) outputting the generated code word.

This code word is modulated by a transmission circuit and then transmitted via an antenna.

Figure 6:
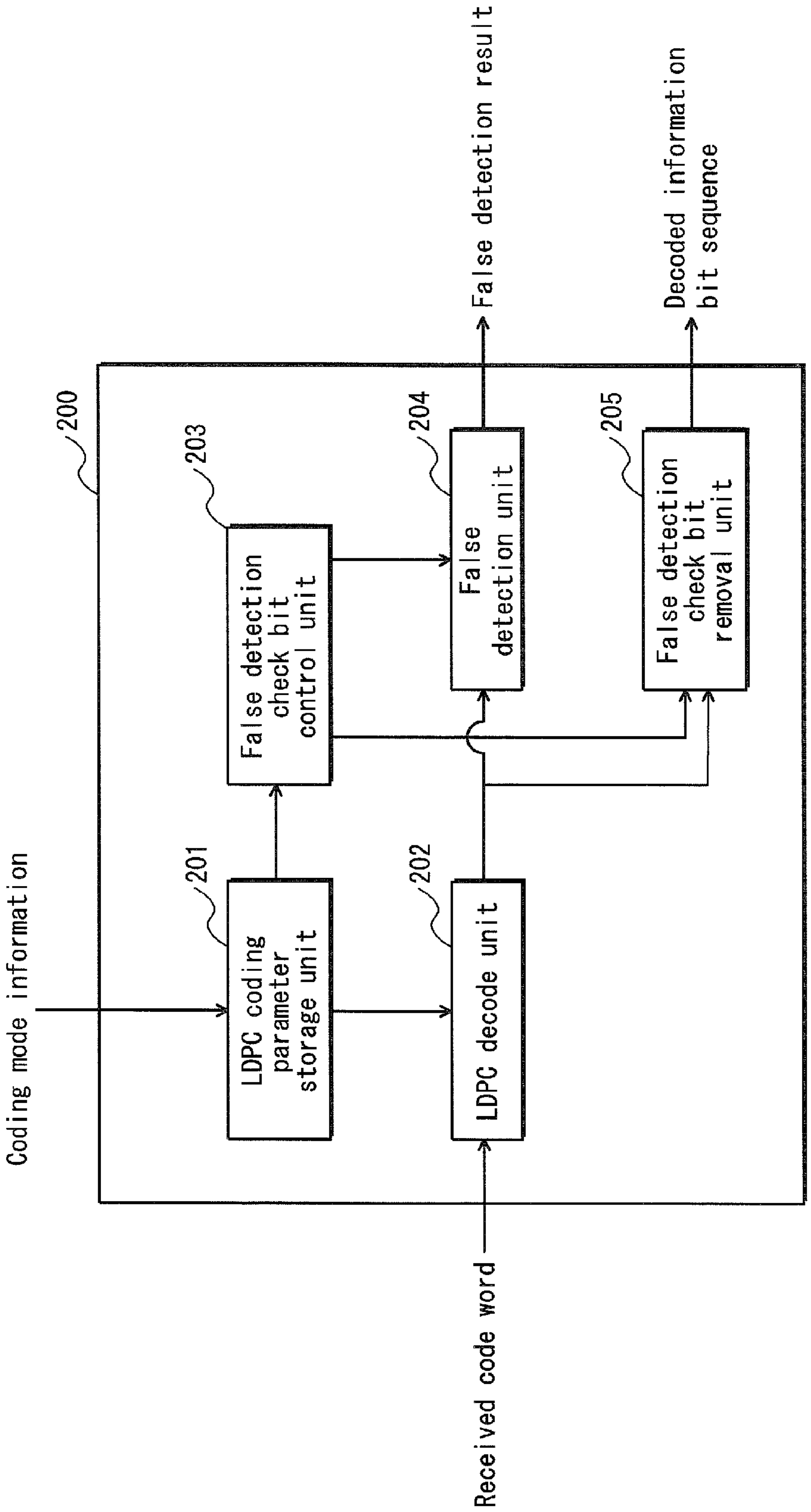
FIG. 6 is a functional block diagram showing a functional structure of a decoding device included in a communication device pertaining to Embodiment 1.

FIG. 6 is a functional block diagram showing the functional structure of the decoding device included in each communication device.

As shown in FIG. 6, the decoding device 200 includes an LDPC coding parameter storage unit 201, an LDPC decode unit 202, a false detection check bit control unit 203, an error detection unit 204, and a false detection check bit removal unit 205.

The LDPC coding parameter storage unit 201 stores therein sets of parameters required for LDPC decode processing and error detection processing, such as a code length N, an information bit length K, a redundant bit length M, a parity check matrix H, the number D of false detection check bits, and false detection check bit insertion positions p. Note that the number of sets of parameters stored in the LDPC coding parameter storage unit 201 is equal to the number of coding modes that could be implemented by the decoding device 200. The LDPC coding parameter storage unit 201 is notified of the coding mode to be implemented via, for example, the coding mode information that specifies at least the codeword length and code rate and that is obtained by decoding a signal received via a reception circuit (not illustrated) of the communication device and analyzing the SIG and H-SIG included in the preamble signal of the decoded signal.

Also, the LDPC coding parameter storage unit 201 transfers the parity check matrix H and false detection check bit insertion positions p corresponding to the notified coding mode information to the false detection check bit control unit 203.

The LDPC decode unit 202 performs the LDPC decode processing on the received code word input to the decoding device 200. The LDPC decode unit 202 performs arbitrary decode processing for decoding the LDPC code, such as sum-product decoding and min-sum decoding. The LDPC decode unit 202 transfers the code word obtained as a result of the LDPC decode processing to the false detection check bit removal unit 205 and the error detection unit 204. It should be mentioned here that the present invention may use any method for LDPC decoding.

The false detection check bit control unit 203 notifies the error detection unit 204 of the false detection check bit insertion positions p notified from the LDPC coding parameter storage unit 201, as well as bit values held by the inserted false detection check bits.

The false detection check bit control unit 203 also notifies the false detection check bit removal unit 205 of the false detection check bit insertion positions p notified from the LDPC coding parameter storage unit 201.

The error detection unit 204 has the function of (i) performing an error detection on the code word obtained as a result of the LDPC decoding, and (ii) outputting the error detection result as a result of detection by the decoding device 200.

Figure 7:
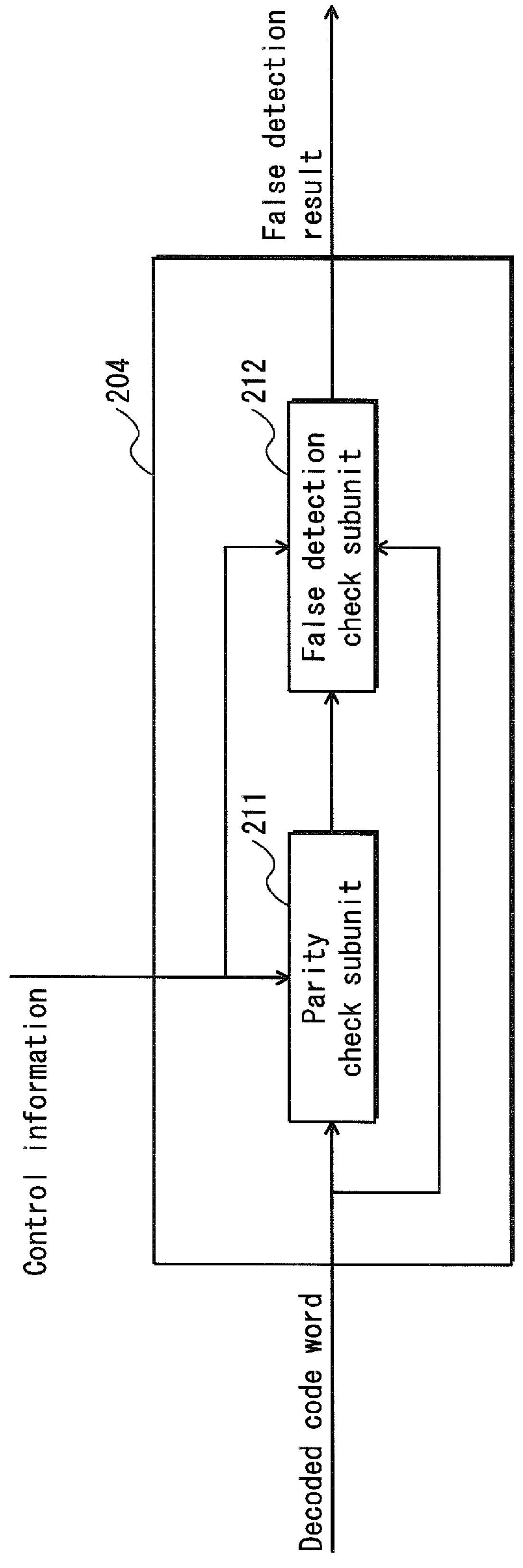
FIG. 7 is a functional block diagram showing a functional structure of an error detection unit.

FIG. 7 shows a detailed functional structure of the error detection unit 204. As shown in FIG. 7, the error detection unit 204 includes a parity check subunit 211 and a false detection check subunit 212.

The parity check subunit 211 checks whether a decoded code word $c_d$ that has been input and the parity check matrix H of the LDPC code that has been provided as control information satisfy the parity check $Hc_d=0$. The parity check subunit 211 outputs a result of the parity check in format that can be interpreted by software or hardware. For example, the parity check subunit 211 outputs "0" when the parity check is satisfied, and outputs "1" when the parity check is not satisfied.

The decoded code word $c_d$, the result of the parity check, and the control information indicating the number, values and insertion positions of false detection check bits are input to the false detection check subunit 212.

When the result of the parity check shows "0", i.e., when the parity check subunit 211 has judged that the parity check is not satisfied, the false detection check subunit 212 checks whether the false detection check bits that have been inserted by the transmitter device into the information bit portions are known bits. The false detection check subunit 212 outputs a result of the false detection check in format that can be interpreted by software or hardware. For example, the false detection check subunit 212 outputs "0" when no false detection has been confirmed, and "1" when a false detection has been confirmed. The result of the false detection check output from the false detection check subunit 212 is also a result of the error detection output from the error detection unit 204. On the other hand, when the result of the parity check shows "1", i.e., when the parity check subunit 211 has judged that the parity check is not satisfied, it is obvious that the decoded code word $c_d$ is not a code word of the LDPC code and is thus erroneous. In this case, there is no need to perform the false detection check. Therefore, in this case, the false detection check subunit 212 outputs "1" as a result of the false detection check without performing the false detection check.

Returning to FIG. 6, the false detection check bit removal unit 205 removes D false detection check bits and M redundant bits based on the false detection check bit insertion positions p that are included in the code word subjected to the LDPC decoding and are notified from the false detection check bit control unit 203. Thereafter, the false detection check bit removal unit 205 outputs only a J-bit decoded information bit sequence as the output from the decoding device 200.

<Data>

A description is now given of an insertion position determination table corresponding to the coding mode information stored in the LDPC coding parameter storage unit 101. The insertion position determination table is information showing association between a mode number, a codeword length, a code rate, and insertion positions. The insertion position determination table is prestored in both the transmitter device and the receiver device.

The mode number is set by the coding device for convenience in order to manage each mode.

The codeword length is information indicating a code length of a code word to be generated. In the case of IEEE 802.11n, the codeword length is one of 648 bits, 1296 bits, and 1944 bits.

The code rate is information indicating the ratio of an information bit sequence to the code word to be generated. In the case of IEEE 802.11n, the code rate is one of 1/2, 2/3, 3/4 and 5/6.

The false detection check bit insertion positions are information indicating insertion positions in which false detection check bits should be inserted for preventing a false detection in the code word to be generated based on the corresponding codeword length and code rate. The false detection check bit insertion positions are also information that defines the orders of bits in which the false detection check bits should be inserted counting from the beginning of the information bit portion of the code word to be generated.

As the transmitter device holds the insertion position determination table, it can determine the insertion positions corresponding to the codeword length and code rate indicated by the coding mode information, and insert the false detection check bits for preventing a false detection.

Furthermore, as the receiver device also holds the insertion position determination table, it can identify the positions in which the false detection check bits have been inserted, and detect whether the received code word is an error-free code word by checking if the bit values at the identified positions are the same as predetermined bit values prestored therein. If the bit values at the identified positions are not the same as the predetermined bit values, then it follows that the received code word is different from a corresponding code word generated by the transmitter device. In this case, a failure in reception can be detected even if the received code word is judged as an error-free code word as a result of the parity check.

It should be noted that the insertion position determination table described herein may be included as part of information relating to the parameters stored in the LDPC coding parameter storage units 101 and 201. Alternatively, the insertion position determination table may be associated with information indicating the number of false detection check bits to be inserted, an information length of an information bit sequence, etc., for each coding mode.

<Operations>

Figure 9:
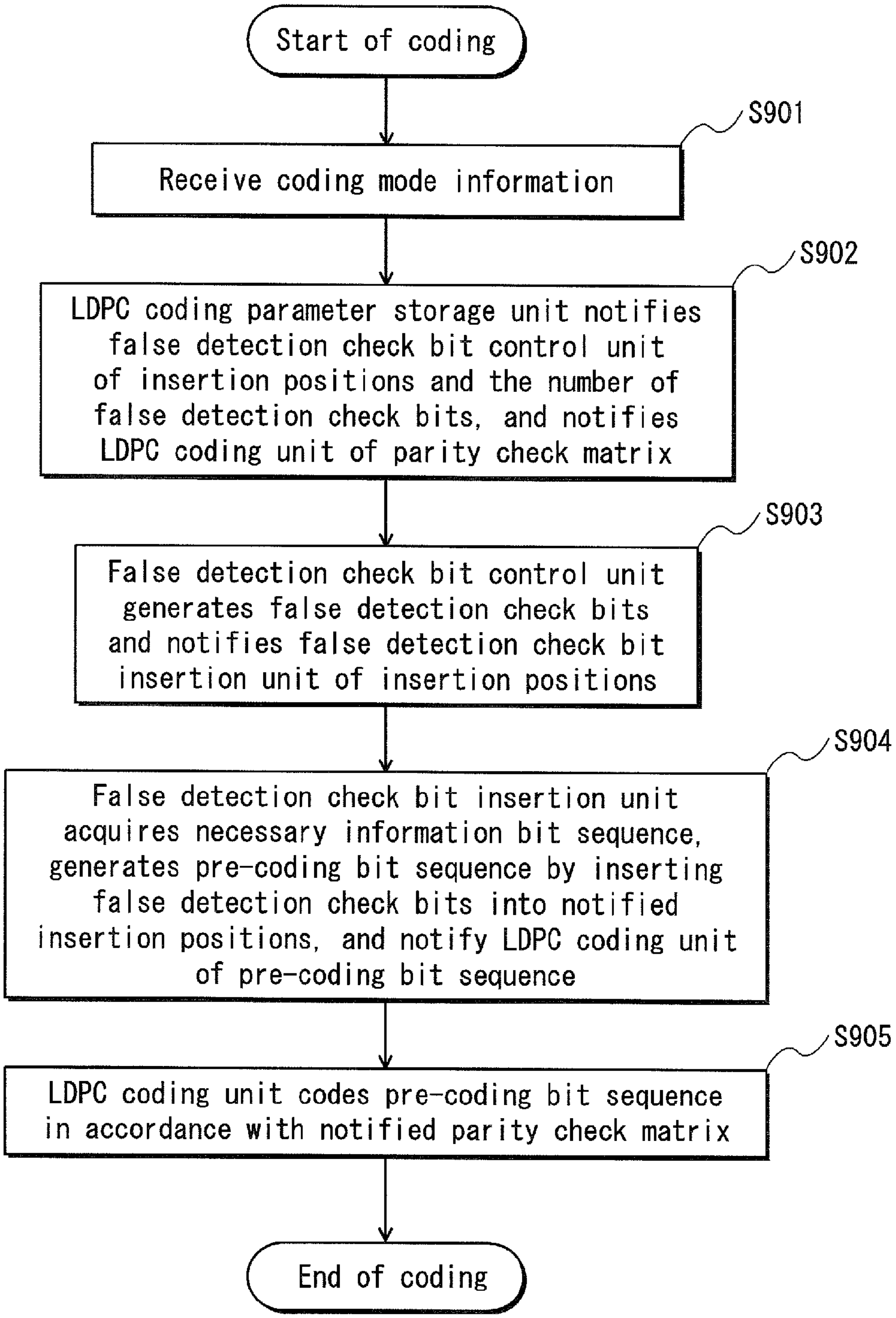
FIG. 9 is a flowchart showing coding operations performed by a coding device pertaining to Embodiment 1.

Described below are coding operations performed by the coding device 100 pertaining to the present embodiment with reference to the flowchart of FIG. 9.

First, the coding device 100 receives coding mode information as input (step S901). This coding mode information is notified from the CPU (not illustrated) or the like of the communication device and has been determined in accordance with, for instance, the communication standard to adopt.

The LDPC coding parameter storage unit 101 identifies false detection check bit insertion positions p based on the codeword length and code rate specified by the coding mode information, and notifies the false detection check bit control unit 102 of the false detection check bit insertion positions p and the number D of false detection check bits to be inserted. Additionally, the LDPC coding parameter storage unit 101 notifies the LDPC coding unit 104 of the parity check matrix H specified by the coding mode information (step S902).

The false detection check bit control unit 102 generates as many predetermined known bits as there are D false detection check bits to be inserted, and notifies the false detection check bit insertion unit 103 of the generated known bits and the false detection check bit insertion positions p (step S903).

After the false detection check bit control unit 102 has notified the false detection check bit insertion unit 103 of the false detection check bit insertion positions p and the bit values to be inserted as false detection check bits, the false detection check bit insertion unit 103 acquires, from a buffer or the like (not illustrated) of the communication device storing therein information to be transmitted, a partial information bit sequence of an information bit portion of a code word to be transmitted, the partial information bit sequence having a shorter information length than the stated information bit portion by the number of false detection check bits to be inserted.

Then, the false detection check bit insertion unit 103 sequentially inserts the notified known bits into the positions specified by the false detection check bit insertion positions p, starting from the beginning of the acquired partial information bit sequence. The false detection check bit insertion unit 103 generates a pre-coding bit sequence through the above procedure, and transfers the generated pre-coding bit sequence to the LDPC coding unit (step S904).

The LDPC coding unit 104 generates a code word by coding the pre-coding bit sequence transferred from the false detection check bit insertion unit 103 in accordance with the parity check matrix H notified from the LDPC coding parameter storage unit 101, outputs the generated code word (step S905), and ends the processing. Code words are generated by repeating the above operations as long as data exists in the buffer storing therein the information to be transmitted.

A transmission circuit provided in the communication device performs subcarrier modulation, FFT, D/A conversion, quadrature modulation, etc. on the code word generated by the LDPC coding unit 104. Thereafter, the code word is transmitted via an antenna.

Described below is one specific example of execution of coding with reference to the flowchart of FIG. 9.

More specifically, the following describes operations performed by the coding device 100 with use of an LDPC code defined by the parity check matrix Hb648 shown in FIG. 1 and having a code length of 648 bits and a code rate of 1/2 as specified in IEEE 802.11n.

The transmitter device inputs coding mode information and an information bit sequence to be coded to the coding device 100. Here, the input information bit sequence is a 310-bit binary sequence, which is shorter than the information block length K (324 bits) by the number D of false detection check bits (14 bits). That is, J=K−D=310. The coding mode information is input to the LDPC coding parameter storage unit 101. The LDPC coding parameter storage unit 101 sets parameters required for the LDPC coding in the false detection check bit control unit 102 and the LDPC coding unit 104 in accordance with the input coding mode information. Examples of the parameters to be set in the false detection check bit control unit 102 include the number D of false detection check bits (14 bits), and false detection check bit insertion positions p (the $82^{nd}$, $84^{th}$,$86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). Examples of the parameters to be set in the LDPC coding unit 104 include the code length N (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

The false detection check bit control unit 102 generates 14 false detection check bits and transfers the same to the false detection check bit insertion unit 103. The false detection check bit insertion unit 103 allocates the false detection check bits respectively to the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits of the 324-bit sequence to be transferred to the LDPC coding unit 104, as specified by the false detection check bit insertion positions p. The false detection check bit insertion unit 103 also allocates 310 information bits contained in the information bit sequence input from the coding device 100 to the remaining 310 positions. Then, the false detection check bit insertion unit 103 transfers the information bit sequence into which the false detection check bits have been inserted (a pre-coding information bit sequence) to the LDPC coding unit 104.

The LDPC coding unit 104 performs LDPC coding processing on the input pre-coding information bit sequence, generates a 324-bit redundant bit sequence, combines the generated 324-bit redundant bit sequence with the 324-bit coded information bit sequence, and finally outputs a result of the combination as a 648-bit code word.

Figures 10A, 10B, 10C:
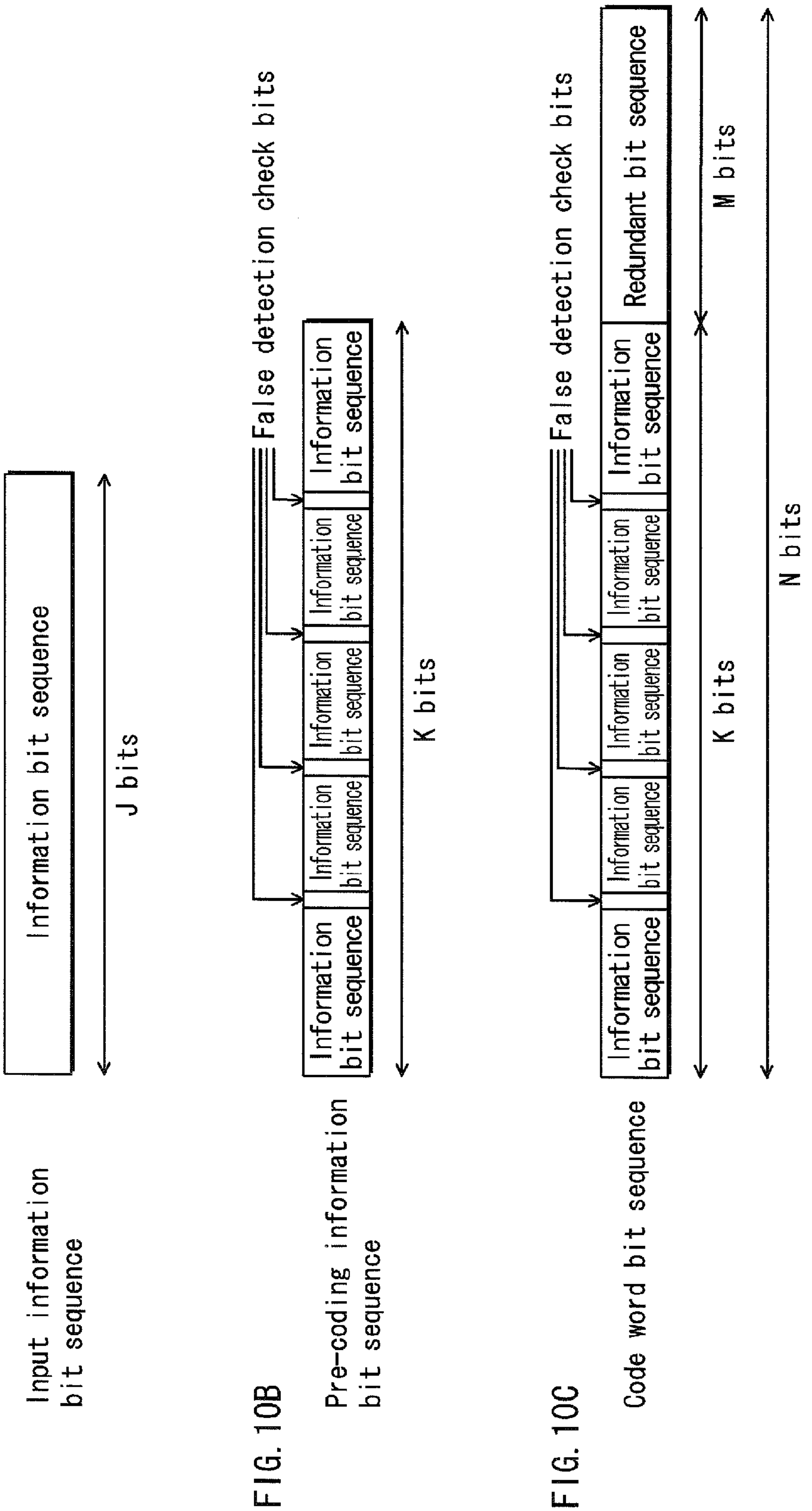
FIGS. 10A to 10C are conceptual diagrams showing a concept of inserting predetermined bit values into an information bit sequence.

With reference to FIGS. 10A to 10C, below is a schematic description of a concept of coding pertaining to the present Embodiment 1 performed in accordance with the coding method shown in FIG. 9.

First of all, let us assume that an information bit sequence shown in FIG. 10A is to be transmitted.

In accordance with the coding mode information, the false detection check bit control unit 102 determines insertion positions in which false detection check bits are to be inserted, and inserts the false detection check bits, which are known bits, into the determined insertion positions. In the present example, the number D of false detection check bits to be inserted is four (i.e., D=4).

In this case, as shown in FIG. 10B, each false detection check bit is inserted between two information bit sequences. As a result, a pre-coding bit sequence is generated.

The LDPC coding unit 104 generates code word bits by appending a redundant bit sequence based on the parity check matrix of the QC-LDPC code (parity bit sequence) to the pre-coding bit sequence shown in FIG. 10B.

Note that in FIGS. 10A to 10C, K bits, M bits and N bits represent the information length of the information bit sequence(s) in the code word, the length of the redundant bit sequence in the code word, and the length of the code word, respectively. The codeword length, namely N bits, is determined based on the coding mode information. K and M are determined based on the code rate included in the coding mode information.

The coding device pertaining to the present embodiment generates a code word in the above manner. Inserting false detection check bits between information bit sequences reduces the throughput of data transfer. However, the amount of information inserted in this manner is smaller than the amount of information inserted by appending a CRC code (for example, as shown in FIG. 2, 14 false detection check bits are inserted to remove all code words having a close Hamming distance). Therefore, the throughput of data transfer resulting from inserting false detection check bits between information bit sequences is still higher than that resulting from appending of the CRC code.

Figure 11:
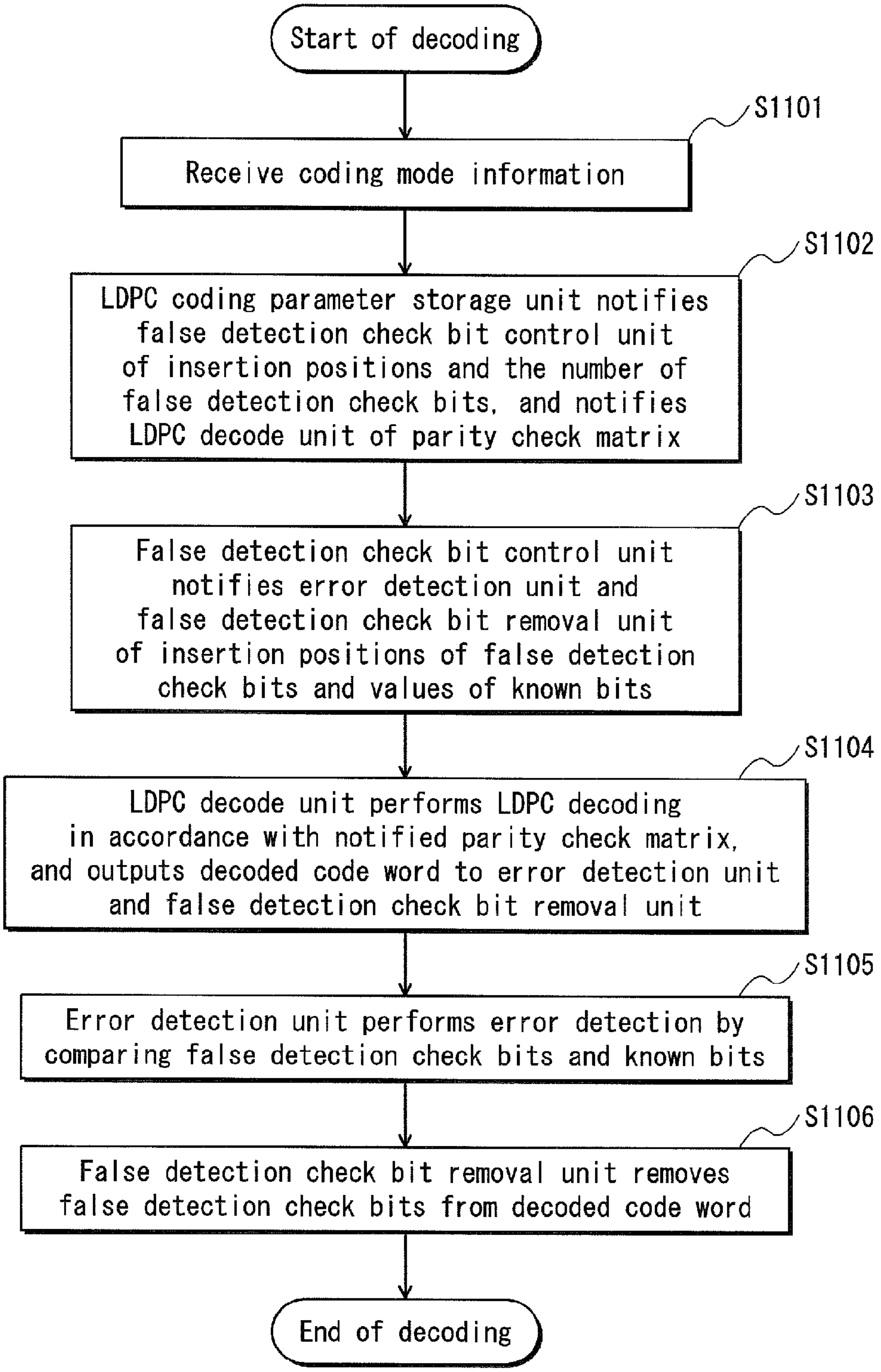
FIG. 11 is a flowchart showing decoding operations performed by a decoding device pertaining to Embodiment 1.

The following describes operations of the decoding device 200 pertaining to the present embodiment with reference to the flowchart of FIG. 11.

The decoding device 200 receives coding mode information showing a codeword length and a code rate by analyzing a preamble of the signal received by the communication device (step S1101).

Upon receiving the coding mode information, the LDPC coding parameter storage unit 201 notifies the false detection check bit control unit 203 of the false detection check bit insertion positions p and the number of false detection check bits, which are identified by the coding mode information. The LDPC coding parameter storage unit 201 also notifies the LDPC decode unit 202 of the parity check matrix H corresponding to the coding mode information (step S1102).

The false detection check bit control unit 203 notifies the error detection unit 204 and the false detection check bit removal unit 205 of the notified false detection check bit insertion positions p as well as values of known bits inserted as the false detection check bits (step S1103).

The LDPC decode unit 202 performs LDPC decoding in accordance with the parity check matrix H notified from the LDPC coding parameter storage unit 201, and notifies the error detection unit 204 and the false detection check bit removal unit 205 of the resultant decoded code word (step S1104).

The error detection unit 204 detects whether the bit values inserted in the notified false detection check bit insertion positions are the same as values of the notified known bits. If the result of the detection is affirmative, then the error detection unit 204 judges the decoded code word as an error-free code word and outputs "0" as an error detection result. On the other hand, if the result of the detection is negative, then the error detection unit 204 judges the decoded code work as an erroneous code word and outputs "1" as an error detection result (step S1105).

The false detection check bit removal unit 205 removes the bit values at the notified false detection check bit insertion positions and the appended redundant bits from the decoded code word, outputs the resultant decoded information bit sequence (step S1106), and ends the decode processing.

In the above manner, the decoding device 200 can detect (i) whether the received and decoded code word satisfies the parity check, and (ii) whether the received and decoded code word is different from a corresponding code word generated by the transmitter device with a close Hamming distance therebetween. The above procedure allows lowering the rate of false detection whereby a code word that is different from a corresponding code word generated by the transmitter device with a close Hamming distance therebetween is judged as an error-free code word.

The following explains one specific example of the above-described error detection and decoding.

More specifically, the following is a description of operations performed by the decoding device 200 with use of an LDPC code defined by the parity check matrix Hb648 shown in FIG. 1 and having a code length of 648 bits and a code rate of 1/2 as specified in IEEE 802.11n.

Before the received code word is input, the coding mode information is input to the decoding device 200. The LDPC coding parameter storage unit 201 transfers LDPC coding parameters which are stored in correspondence with the received coding mode information to the LDPC decode unit 202 and the false detection check bit control unit 203. Examples of the parameters to be set in the false detection check bit control unit 203 include the number of false detection check bits (14) and false detection check bit insertion positions p (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). Examples of the parameters to be set in the LDPC decode unit 202 include the code length (N) (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

After the parameters to be used are set, the LDPC decode processing begins for the received code word. The received 648-bit code word is input to the LDPC decode unit 202. At this time, in the received code word, one bit may carry one-bit information (hard-decision decoding), or one bit may carry multiple-bit information (soft-decision decoding). In the case of soft-decision decoding, log-likelihood ratios of quantized code word bits may be used as the received code word. The LDPC decode unit 202 performs LDPC decode processing on the received code word, and transfers the resultant code word to the error detection unit 204 and the false detection check bit removal unit 205.

The false detection check bit removal unit 205 removes, from the code word transferred from the LDPC decode unit 202, the bits in the false detection check bit insertion positions p notified from the false detection check bit control unit 203 (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). The false detection check bit removal unit 205 also removes the 324 redundant bits from the code word, and outputs the remaining 310-bit sequence as the decoded information bit sequence.

Due to the above structure, the decoding device 200 can lower the rate of false detection whereby a received code word that satisfies the parity check but is an erroneous code word is judged as an error-free code word.

As has been described above, the coding device pertaining to the present Embodiment 1 inserts false detection check bits, which are known bits predetermined by the transmitter device and the receiver device, into a code word generated based on an information bit sequence to be transmitted. Specifically, in the generated code word, the false detection check bits are inserted into portions that would be different from another code word to be received and decoded by the receiver device, said another code satisfying the parity check and having a close Hamming distance with respect to the generated code word. In the receiver device, if the false detection check bits inserted in the received and decoded code word are different from the predetermined known bits, then the received and decoded code word is judged to be different from the corresponding code word generated by the transmitter device, and thus a failure in reception of an error-free code word can be detected. In addition, the above structure allows lowering the rate of false detection wherein at least part of a received and decoded code word that (i) is judged as error-free by the parity check in the receiver device but (ii) is not a corresponding code word generated by the transmitter device is judged as error-free.

<Observation>

The following describes differences between the present embodiment and the technology of Patent Literature 1 that, as with the present embodiment, makes use of known bits holding known values in error-correction decoding processing.

Patent Literature 1 describes a decoding method utilizing the maximum a posteriori probability decoding. According to this decoding method, when decoding transmission words that include known bits with known values, a decoded word candidate in which a known value in a part of a transmission word has been changed to another value is excluded from the decoded word candidates.

As a result of comparison between the present Embodiment 1 and the technology of Patent Literature 1 in terms of the structure of a transmitter device, the following difference was found: as the technology of Patent Literature 1 utilizes known bits included in data to be transmitted, such as synchronization bytes of MPEG-2TS packets, it neither inserts known bits into a data sequence, nor controls insertion positions of the known bit. That is, the technology of Patent Literature 1 cannot achieve the effect of improvement in the error detection accuracy that can be obtained by, as described in the present Embodiment 1, inserting known bits into bit positions that hold different values between an error-free code word and a minimum-distance code word.

Moreover, as a result of comparison between the present Embodiment 1 and the technology of Patent Literature 1 in terms of the structure of a receiver device, the following difference was also found: according to the decoding method disclosed in Patent Literature 1, decoding is performed after removing, from a plurality of decoded word candidates, one or more decoded word candidates whose known bits hold different values. That is to say, the technology of Patent Literature 1 does not relate to an error detection method. It seems like the technology of Patent Literature 1 has a structure in which a false detection check is performed prior to error-correction coding. However, the MAP decoding used in the technology of Patent Literature 1 is a decoding method for maximizing a posteriori probability of each bit of code words. Therefore, a code word sequence obtained as a result of the MAP decoding is not necessarily composed of code words of the code used by the transmitter device. Even if such a code word sequence were composed of code words of the code used by the transmitter device, there is a possibility that values of bits at positions of known bits change in the course of the MAP decoding. For the above reasons, according to the technology of Patent Literature 1 the effect of improvement in the error detection accuracy cannot be achieved by the false detection check.

The technology of the present Embodiment 1 for preventing a false detection may incorporate any decoding method in error-correction decoding. Hence, the false detection prevention technology of the present Embodiment 1 may be adapted to the decoding method of Patent Literature 1. In which case, the effect of improvement in the error detection accuracy, which cannot be achieved solely by the decoding method of Patent Literature 1, can be achieved.

[Embodiment 2]

The above Embodiment 1 discloses technology for controlling insertion positions of false detection check bits so as to lower the rate of false detection whereby an erroneous code word is judged as an error-free code word. The present Embodiment 2 provides a description of technology that makes use of information to be transmitted rather than inserting predetermined bit values as false detection check bits, and therefore can suppress reduction in the throughput of data transfer caused by insertion of false detection check bits.

<Concepts>

In a case where the information length of an actual information bit sequence is shorter than the information length of an information bit portion determined by the codeword length and code rate, a code word is generated in the following manner: known bits that have been predetermined as pseudo information (also called shortening bits) are appended so that the information length of the actual information bit sequence equals the information length of the information bit portion. In other words, appending of the known bits has been determined from the beginning, and thus does not result in a throughput reduction.

In view of the above, the present Embodiment 2 describes an example of how to raise the rate of prevention of false detection whereby an erroneous code word is judged as an error-free code word by the parity check. More specifically, the rate of prevention of false detection can be raised by inserting known bits that have been determined to be appended as false detection check bits into the information bit sequence.

Below, a specific example of a conventional method for inserting shortening bits, as well as a concept of insertion of false detection check bits by using shortening bits pertaining to the present Embodiment 2, will be explained in that order with reference to FIGS. 12A-1 through 13E.

As an LDPC code is a block code, coding of the LDPC code is performed as follows. Coding processing is performed on the input, namely a K-bit information bit sequence; an M-bit redundant bit sequence is appended to the K-bit information bit sequence; and a resultant N-bit code word is output. FIGS. 12A-1 and 12B-1 each illustrate an input information bit sequence. FIGS. 12A-2 and 12B-2 each illustrate a state where the information bit sequence has been divided into smaller information bit sequences each having the size for an LDPC code block. FIGS. 12A-3 and 12B-3 each illustrate a state where the divided information bit sequences have been coded. FIGS. 12A-4 and 12B-4 each illustrate a code word to be ultimately output.

Assume a case where the input information bit sequence is shorter than K bits. In a communication system conforming to IEEE 802.11n and the like, the size of data to be transmitted varies depending on the time of transmission. Hence, in many cases, the size of data to be transmitted is not an integral multiple of the information bit length K of the LDPC code. In a case where the size of data to be transmitted is not an integral multiple of the information bit length K of the LDPC code, if K-bit information bit sequences are input to the LDPC coder one after another, then the number of bits contained in the last LDPC code block to be coded is less than K. At this time, as shown in FIG. 12A-3, a K-bit sequence is generated by appending a certain number of (in this example, S) known bits (shortening bits, usually having a value "0") at the end or in a given position of information bits of the last LDPC code block, so that the last LDPC code block would have a length of K bits. Thereafter, the generated K-bit sequence is coded. After the coding is performed, the appended S known bits are removed, and the resultant sequence is output as a code word. The above coding method is called shortening coding (alternatively, a code word obtained without removing the S known bits may be transmitted as-is).

Similarly, in a case where a plurality of blocks are to be coded after an attempt to allocate the same number of information bits to each block, one of the blocks ends up with containing less than K information bits as shown in FIG. 12B-2. In this case also, the shortening coding is performed by inserting S known bits. As indicated in Non-Patent Literature 2, in the case of IEEE 802.11n, known bits are appended to the end of an information bit sequence of each LDPC code block, so that each LDPC code block contains an equal number of known bits.

The known bits used for shortening coding (hereinafter referred to as shortening bits) are appended in order to make a bit sequence input to the coder contain K bits. The positions in which the shortening bits are appended in the input sequence do not affect processing of shortening coding itself. An error-correction coding device pertaining to the present embodiment inserts false detection check bits into insertion positions of shortening bits—i.e., the error-correction coding device uses the same known bits for the purposes of shortening and false detection check. This helps lower the degree of throughput reduction.

Figures 13A, 13B, 13C, 13D, 13E:
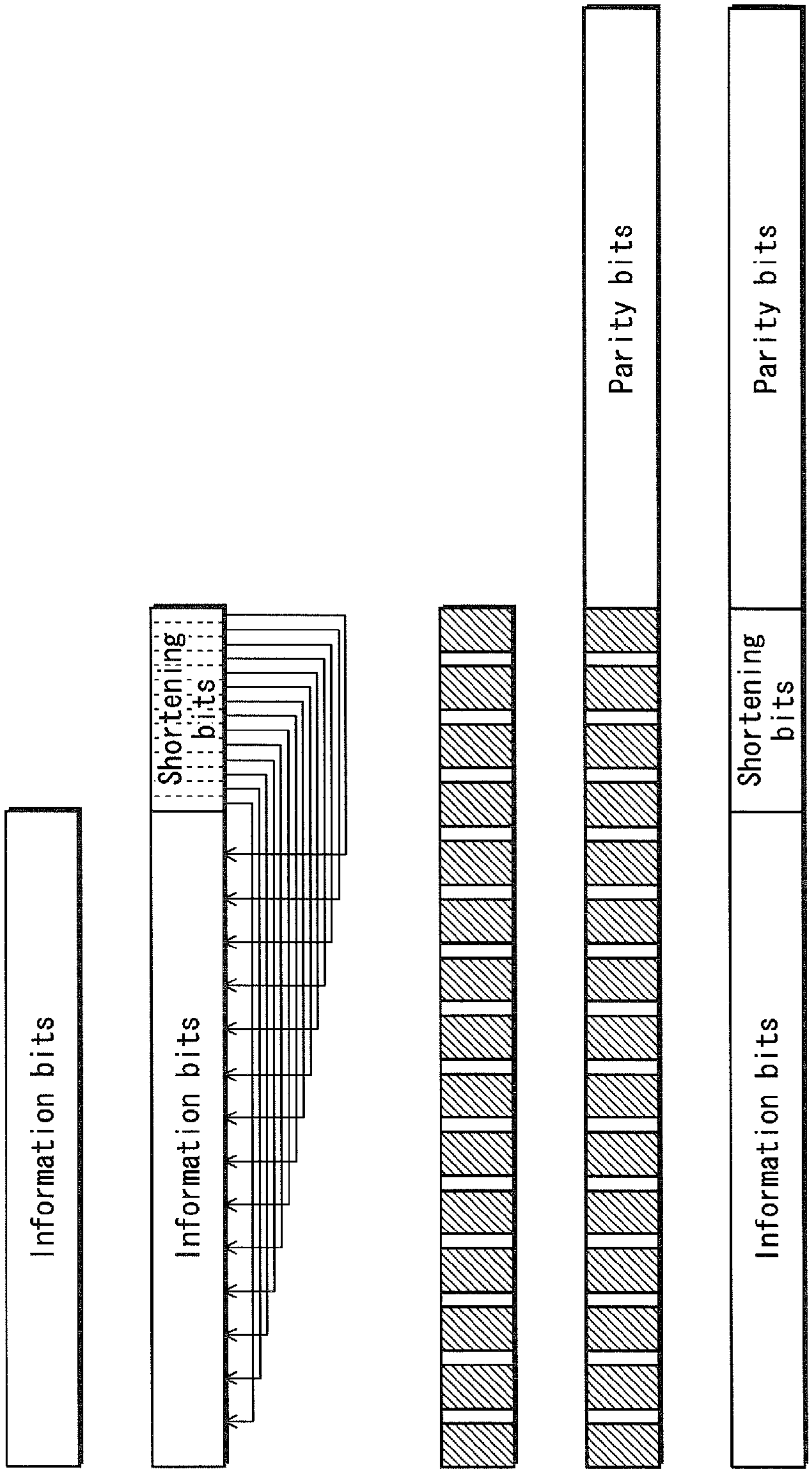
FIGS. 13A to 13E are conceptual diagrams relating to insertion of false detection check bits pertaining to Embodiment 2.

With reference to FIGS. 13A to 13E, the following describes a concept of coding pertaining to the present Embodiment 2, which uses the shortening bits shown in FIGS. 12A-3 and 12B-3. FIG. 13A shows an information bit sequence. As this information bit sequence has a smaller size than an LDPC code block, shortening bits are appended to this information bit sequence as shown in FIG. 13B.

At this time, the transmitter device and the receiver device both use known values for the shortening bits. In addition, the shortening bits may be inserted anywhere in the information bit sequence. Thus, the appended shortening bits and information bits in the information bit sequence are rearranged so as to relocate the shortening bits to the insertion positions of false detection check bits of the information bit sequence. Put another way, the shortening bits are inserted into the insertion positions of the false detection check bits within the information bits.

As a result, a pre-coding bit sequence shown in FIG. 13C is generated. Then, redundant bits (parity bits) based on the LDPC code are appended to the generated pre-coding bit sequence as shown in FIG. 13D. Thereafter, the inserted shortening bits may be removed. Note that in FIGS. 13C and 13D, the rectangular portions with diagonal lines represent the information bit sequence.

Also note that FIG. 13E simply shows an example of a conventional code word that has been coded with shortening bits appended to the end of information bits.

As set forth above, the present Embodiment 2 incorporates shortening bits to be appended as false detection check bits.

<Structure>

Figure 14:
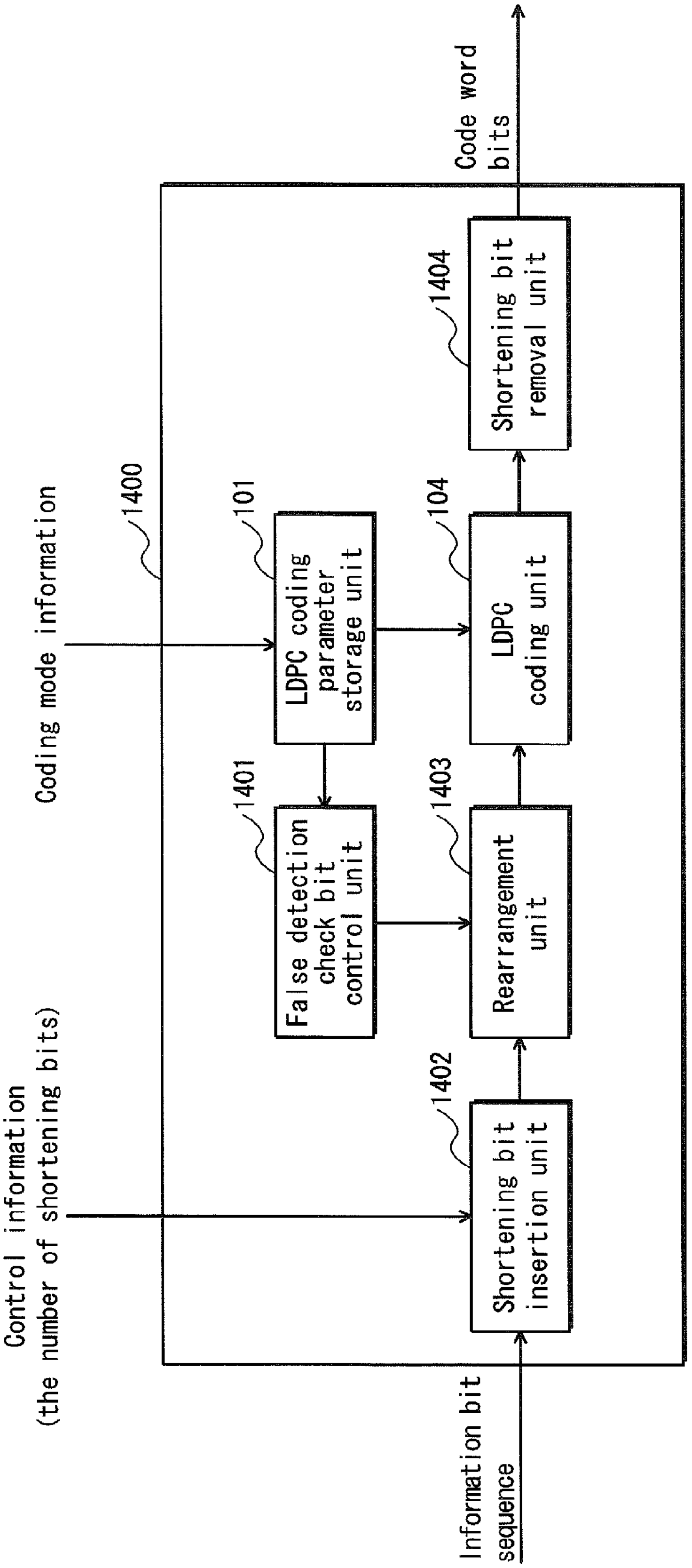
FIG. 14 is a functional block diagram showing a functional structure of a coding device pertaining to Embodiment 2.

FIG. 14 shows a functional structure of a coding device 1400 pertaining to Embodiment 2. As shown in FIG. 14, the coding device 1400 includes an LDPC coding parameter storage unit 101, an LDPC coding unit 104, a false detection check bit control unit 1401, a shortening bit insertion unit 1402, a rearrangement unit 1403, and a shortening bit removal unit 1404. Note that the coding device 1400 is different from the coding device 100 described in Embodiment 1 in including the shortening bit insertion unit 1402, the rearrangement unit 1403, and the shortening bit removal unit 1404. The following description of the coding device 1400 is given with a focus on the differences between the coding device 1400 and the coding device 100 described in Embodiment 1.

The false detection check bit control unit 1401 notifies information indicating the number D of false detection check bits and false detection check bit insertion positions p, which is transferred from the LDPC coding parameter storage unit 101, to the rearrangement unit 1403.

The shortening bit insertion unit 1402 inserts shortening bits to the end of the information bit sequence. Here, the number of shortening bits to be inserted is provided to the shortening bit insertion unit 1402 as control information. If the transmitter device and the receiver device both acknowledge where the shortening bits are inserted, then the insertion positions of the shortening bits are not limited to the end of the information bit sequence. Also, the shortening bits are inserted so that the information length of the information bit sequence is a multiple of the information length of an information bit sequence portion of the code word to be generated. In other words, the number of shortening bits to be inserted is determined based on the information length of the information bit sequence and the information length of the information bit sequence portion of the code word to be generated.

The rearrangement unit 1403 rearranges the order of bits in the information bit sequence into which the shortening bits have been inserted. More specifically, this rearrangement is done by relocating the shortening bits currently positioned to the end of the information bit sequence to the false detection check bit insertion positions.

The shortening bit removal unit 1404 removes the shortening bits included in the code word bits output from the LDPC coding unit 104. The shortening bit removal unit 1404 outputs the code word bits from which the shortening bits have been removed.

Figure 15:
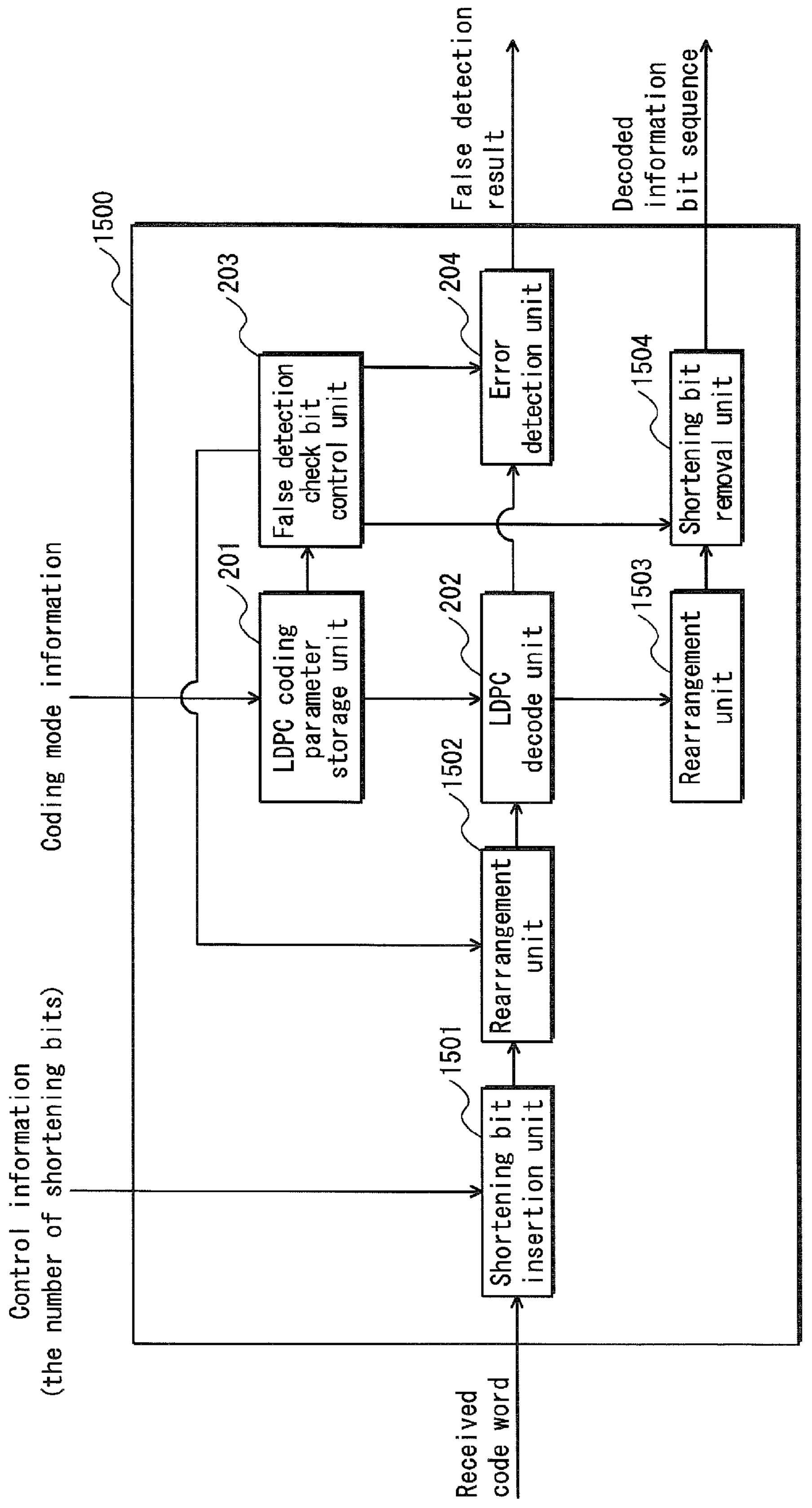
FIG. 15 is a functional block diagram showing a functional structure of a decoding device pertaining to Embodiment 2.

FIG. 15 shows a functional structure of a decoding device 1500 pertaining to Embodiment 2. As shown in FIG. 15, the decoding device 1500 includes an LDPC coding parameter storage unit 201, an LDPC decode unit 202, a false detection check bit control unit 203, an error detection unit 204, a shortening bit insertion unit 1501, a rearrangement unit 1502, a rearrangement unit 1503, and a shortening bit removal unit 1504. As with the above description of the coding device 1400, the following description of the decoding device 1500 is given with a focus on the differences between the decoding device 1500 and the decoding device 200 described in Embodiment 1.

The shortening bit insertion unit 1501 inserts shortening bit likelihoods to the end of the received code word. It should be noted here that the shortening bit likelihoods are values corresponding to the shortening bits inserted by the transmitter device and to a decoding method used in the LDPC decode unit 202. For example, in a case where the transmitter device inserts "0" as shortening bits and the LDPC decode unit 202 performs soft-decision decoding, a positive number having a large absolute value should be inserted as each shortening bit likelihood. On the other hand, in a case where the LDPC decode unit 202 performs hard-decision decoding, "0" is inserted as each shortening bit likelihood. The shortening bit insertion unit 1501 transfers the received code word into which the shortening bit likelihoods have been inserted to the rearrangement unit 1502.

The rearrangement unit 1502 rearranges bits in the received code word transferred from the shortening bit insertion unit 1501. More specifically, this arrangement is done by relocating the shortening bit likelihoods inserted by the shortening bit insertion unit 1501 to the positions designated by the false detection check bit positions p transferred from the false detection check bit control unit 203. The rearrangement unit 1502 transfers the received code word with rearranged bits to the LDPC decode unit 202. The shortening bits, which were deleted at the time of transmission, are restored. Thereafter, the shortening bits can be rearranged so as to return back to the positions where they were originally inserted as false detection check bits.

The rearrangement unit 1503 rearranges bits in the decoded code word obtained as a result of the decode processing performed by the LDPC decode unit 202. More specifically, this rearrangement is done by relocating the shortening bits at the shortening bit insertion positions p to the end of the decoded code word bits. The rearrangement unit 1503 transfers the decoded code word with rearranged bits to the shortening bit removal unit 1504.

The shortening bit removal unit 1504 removes the shortening bits and parity bits from the end of the decoded code word bits that have been rearranged and transferred from the rearrangement unit 1503. Consequently, the shortening bit removal unit 1504 obtains a J-bit information bit sequence. The shortening bit removal unit 1504 outputs the J-bit information bit sequence as the output from the decoding device 1500.

This concludes the description of functional structures of the coding device 1400 and decoding device 1500 pertaining to Embodiment 2.

<Operations>

Figure 16:
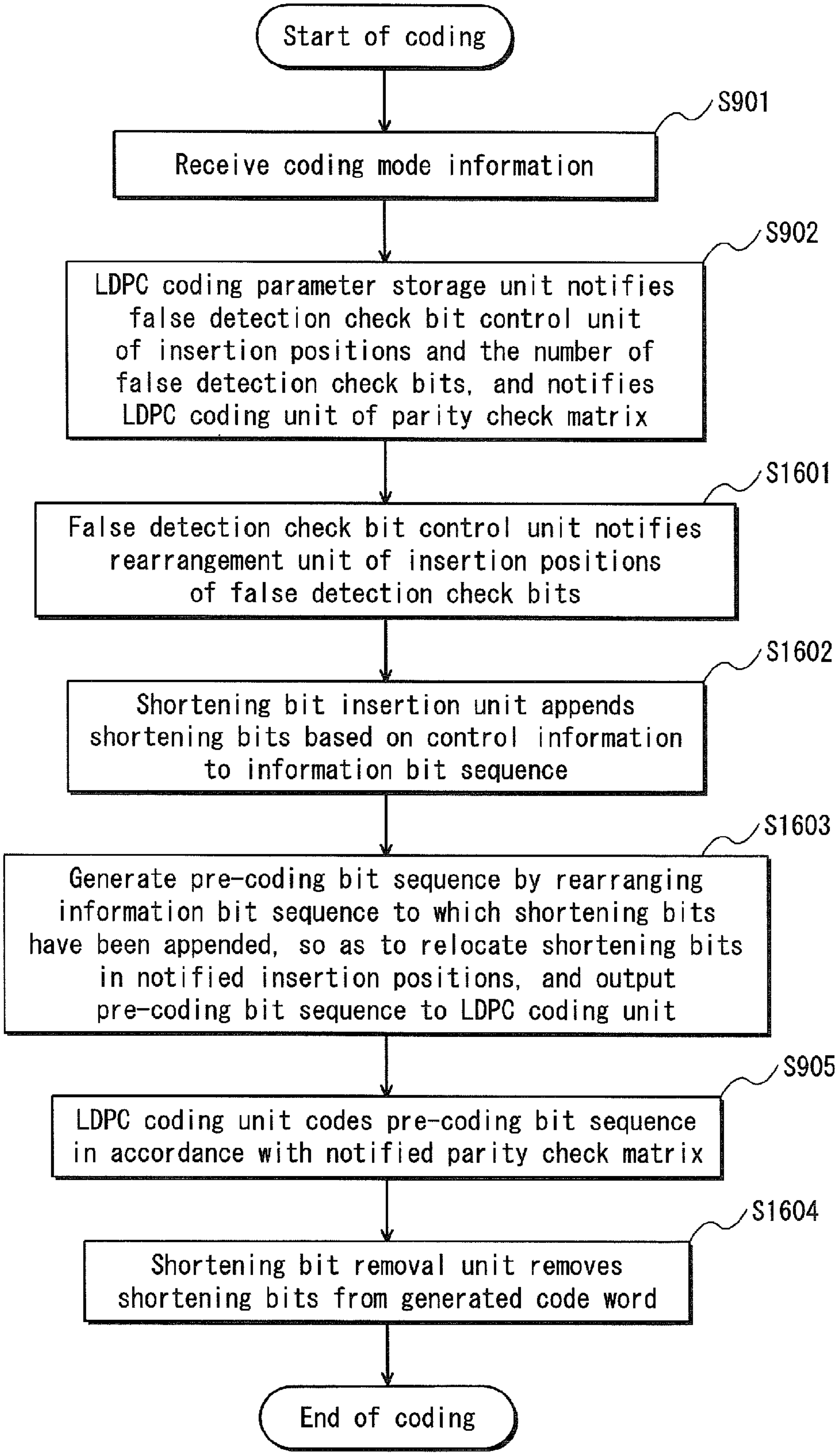
FIG. 16 is a flowchart showing coding operations performed by a coding device pertaining to Embodiment 2.

The following describes coding operations performed by the coding device 1400 with reference to the flowchart of FIG. 16. Note that part of the flowchart of FIG. 16 that is the same as the flowchart of FIG. 9 pertaining to Embodiment 1 is omitted from the following description.

As shown in FIG. 16, the false detection check bit control unit 1401 notifies the rearrangement unit 1403 of the insertion positions and the number of false detection check bits (step S1601).

The shortening bit insertion unit 1402 in the coding device 1400 receives control information indicating the number of shortening bits to be inserted, appends the number of shortening bits indicated by the control information to the end of the input information bit sequence, and outputs the resultant information bit sequence to the rearrangement unit 1403 (step S1602).

Next, the rearrangement unit 1403 rearranges bits in the received information bit sequence to which the shortening bits have been appended. More specifically, the rearrangement unit 1403 performs this rearrangement so that, per an information length of an information bit portion in a generated code word, the shortening bits are located in the false detection check bit insertion positions notified from the false detection check bit control unit 1401. Thereafter, the rearrangement unit 1403 transfers the rearranged pre-coding bit sequence to the LDPC coding unit 104 (step S1603).

The LDPC coding unit 104 generates a code word by coding the transferred pre-coding bit sequence in accordance with the parity check matrix notified from the LDPC coding parameter storage unit, and transfers the generated code word to the shortening bit removal unit 1404 (step S905).

The shortening bit removal unit 1404 removes shortening bits from the generated code word (step S1604), and ends the processing.

The above has explained the flowchart of FIG. 16 in relation to the case where shortening bits have been inserted. However, when shortening bits need not be inserted into an information bit sequence—i.e., when the information length of the information bit sequence equals the information length of a block pertaining to a coding method utilizing quasi-cyclic codes, false detection check bits holding known values shall be inserted into specified positions as described in the above Embodiment 1.

Described below is one specific example of this coding method. First, a description is given of a specific example where the number of shortening bits to be appended is 14 or more.

To be more specific, the following description relates to the case of J=300, as one exemplary case where the sequence length J of the input information bit sequence is shorter than the information block length K (324) by at least the number D of false detection check bits (14). At this time, the number S of shortening bits is 24. The coding mode information is input to the LDPC coding parameter storage unit 101. In accordance with the input coding mode information, the LDPC coding parameter storage unit 101 sets parameters required for LDPC coding in the false detection check bit control unit 102 and the LDPC coding unit 104. Examples of the parameters set in the false detection check bit control unit 102 include the number of false detection check bits, namely 14, and false detection check bit insertion positions p (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). Examples of the parameters set in the LDPC coding unit 104 include the code length N (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

The input information bit sequence composed of 300 bits is input to the shortening bit insertion unit 1402. The shortening bit insertion unit 1402 inserts 24 shortening bits into the end of the input information bit sequence. The shortening bit insertion unit 1402 transfers the information bit sequence, now having a 324-bit length as a result of insertion of the shortening bits, to the rearrangement unit 1403.

The rearrangement unit 1403 rearranges the 324-bit information bit sequence. To be more specific, the rearrangement unit 1403 rearranges (i) the shortening bits, which make up the last 14 bits of the information bit sequence, and (ii) the bits located in the false detection check bit insertion positions p, namely the $82^{nd}$, $84^{th}$, $86^{th}$, $88^{th}$, $90^{th}$, $92^{nd}$, $94^{th}$, $96^{th}$, $96^{th}$, $100^{th}$, $102^{nd}$, $104^{th}$, $106^{th}$, and $108^{th}$ bits. This makes all the bits located in the false detection check bit insertion positions p the known bits. The rearrangement unit 1403 transfers the rearranged information bit sequence to the LDPC coding unit 104. In performing the rearrangement processing, the rearrangement unit 1403 may use any rearrangement rule as long as it can rearrange the bits located in the false detection check bit insertion positions p and the shortening bits.

The LDPC coding unit 104 performs processing of LDPC coding on the input pre-coding information bit sequence, generates a 324-bit redundant bit sequence, combines the generated 324-bit redundant bit sequence with the 324-bit coded information bit sequence, and outputs a result of the combination as a 648-bit code word to the shortening bit removal unit 1404.

The shortening bit removal unit 1404 performs processing of removing S (24) shortening bits inserted by the shortening bit insertion unit 1402 from the code word bits. As a result of removal of the shortening bits, the code word has a 624-bit length (300+324=624). The shortening bit removal unit 1404 outputs the 624-bit code word as the output from the coding device 1400.

A code word is generated through the above procedure.

Meanwhile, as described in the above Embodiment 1, at least 14 bits need to be inserted as false detection check bits in order to perform error detection for all of the minimum-distance code words. However, in some cases, the number of shortening bits is smaller than 14 depending on the information length of the information bit sequence. In consideration of such cases, the following describes a specific example where the number of shortening bits to be appended is smaller than 14. It should be noted that the coding device itself merely appends a specified number of shortening bits and rearrange the shortening bits by relocating them to the specified false detection check bit insertion positions. That is to say, the coding device basically operates in accordance with the flowchart of FIG. 16. Generality of the flowchart of FIG. 16 is retained regardless of the number of shortening bits to be appended.

Next, a description is given of a case where the number S of shortening bits is smaller than the number D of false detection check bits. As one example, the following discusses the case of J=320 bits. More specifically, in this case, S=4 and D=14.

An input information bit sequence composed of 320 bits is input to the shortening bit insertion unit 1402. The shortening bit insertion unit 1402 inserts the 4 shortening bits into the end of the input information bit sequence. The shortening bit insertion unit 1402 transfers the information bit sequence, now having a 324-bit length as a result of insertion of the shortening bits, to the rearrangement unit 1403.

The rearrangement unit 1403 rearranges the 324-bit information bit sequence. More specifically, the rearrangement unit 1403 rearranges (i) the shortening bits, which make up the last four bits of the information bit sequence, and (ii) the four bits located in the false detection check bit insertion positions p, namely, the $82^{nd}$, $84^{th}$, $86^{th}$, and $88^{th}$ bits, for example. This makes the 4 bits located in the false detection check bit insertion positions p the known bits. The rearrangement unit 1403 transfers the rearranged information bit sequence to the LDPC coding unit 104. In the rearrangement processing performed by the rearrangement unit 1403, the four positions to be selected from the false detection check bit insertion positions p are not limited to the above-described four positions, as long as they are known to the transmitter device and the receiver device. Selecting four positions different from the above-described four positions merely changes a code word on which the false detection is performed, and does not change the rate at which the false detection can be made on average. In the above case, however, not all of the minimum-distance code words can be detected because the number S of shortening bits is smaller than the number D of false detection check bits. Thus, in the above case, the rate at which the false detection can be made is low as compared to the case of S≥D.

The LDPC coding unit 104 performs processing of LDPC coding on the input pre-coding information bit sequence, generates a 324-bit redundant bit sequence, combines the generated 324-bit redundant bit sequence with the 324-bit coded information bit sequence, and outputs a result of the combination as a 648-bit code word to the shortening bit removal unit 1404.

The shortening bit removal unit 1404 performs processing of removing the S (4) shortening bits, which have been inserted by the shortening bit insertion unit 1402, from the code word bits. As a result of removal of the shortening bits, the code word has a 644-bit length (320+324=644). The shortening bit removal unit 1404 outputs the 644-bit code word as the output from the coding device 1400.

In the above description, the coding device 1400 includes the shortening bit insertion unit 1402 and performs insertion of the shortening bits on its own. However, the present embodiment is not limited to this structure. Alternatively, for example, an information bit sequence into which shortening bits have already been inserted may be input to the coding device 1400. In this case, the coding device 1400 need not include the shortening bit insertion unit 1402 because it does not perform the processing of inserting the shortening bits on its own.

Figure 17:
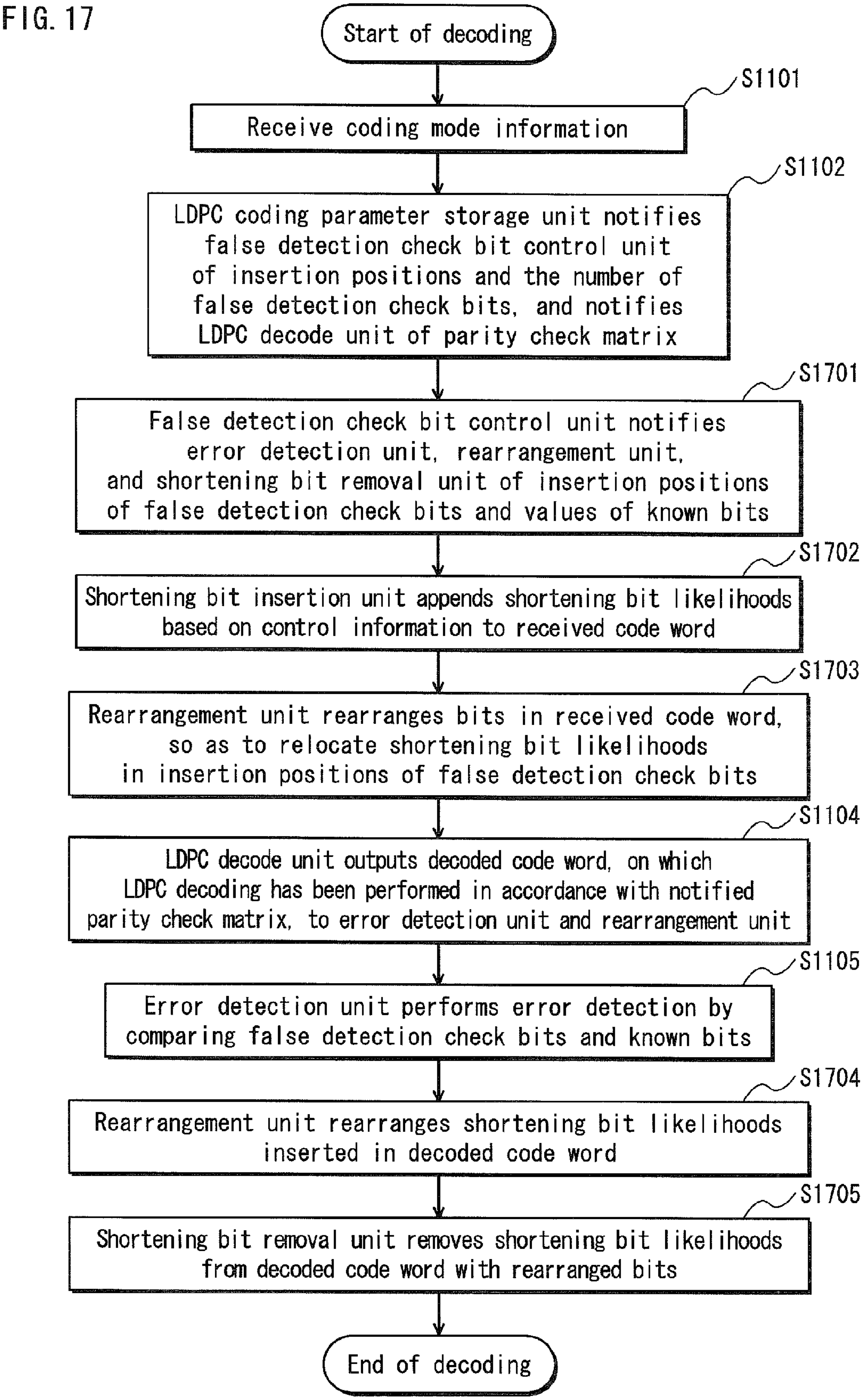
FIG. 17 is a flowchart showing decoding operations performed by a decoding device pertaining to Embodiment 2.

With reference to the flowchart of FIG. 17, the following describes operations performed by the decoding device 1500 upon receiving the code word that has been generated in the above manner, modulated, and transmitted. In the following description, part of the flowchart of FIG. 17 that is the same as the flowchart of FIG. 11 pertaining to Embodiment 1 is omitted.

In step S1701, the false detection check bit control unit 203 notifies the error detection unit 204, the rearrangement unit 1502, and the shortening bit removal unit 1504 of false detection check bit insertion positions, as well as known values used as the false detection check bits.

Next, the shortening bit insertion unit 1501 inserts shortening bit likelihoods into the received code word in accordance with the control information (step S1702). At this time, the number of the shortening bit likelihoods to be inserted corresponds to the number of shortening bits and the number of parity bits generated based on the shortening bits.

Then, the rearrangement unit 1502 rearranges bits in the received code word to which the shortening bit likelihoods have been appended, by relocating the shortening bit likelihoods to the false detection check bit insertion positions (step S1703).

In step S1704, the rearrangement unit 1503 extracts the bits located at the false detection check bit insertion positions and relocates the extracted bits to the end of the information bit sequence, so as to place the shortening bit likelihoods inserted in the decoded code word in the end of the information bit sequence.

Thereafter, the shortening bit removal unit 1504 removes the parity bits as well as the shortening bits relocated to the end from the rearranged decoded code word (step S1705), outputs the decoded information bit sequence, and ends the processing.

The following describes a specific example of operations to be executed when the decoding device performs decoding in accordance with the flowchart of FIG. 17.

More specifically, the following description relates to operations performed by the decoding device 1500 with use of an LDPC code defined by the parity check matrix Hb648 shown in FIG. 1 and having a code length of 648 bits and a code rate of 1/2 as specified in IEEE 802.11n.

Before the received code word is input, the coding mode information and the number of shortening bits are input to the decoding device 1500. In accordance with the coding mode information, the LDPC coding parameter storage unit 201 transfers LDPC coding parameters which are stored in correspondence with the received coding mode information to the LDPC decode unit 202 and the false detection check bit control unit 203. Examples of the parameters set in the false detection check bit control unit 203 include the number of false detection check bits, namely 14, and false detection check bit insertion positions p (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). Examples of the parameters set in the LDPC decode unit 202 include the code length N (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

The following description pertains to a case where the number J of bits in the information bit sequence is 300, and the number S of shortening bits is 24. After the parameters to be used are set, the LDPC decode processing begins for the received code word. The received 624-bit code word is input to the shortening bit insertion unit 1501. The shortening bit insertion unit 1501 inserts 24-bit shortening bit likelihoods between an information bit portion and a parity bit portion (i.e., to the end of the information bit portion) in the received code word. As a result, the information bit portion in the received code word increases by 24 bits. The shortening bit insertion unit 1501 transfers the received code word into which the shortening bit likelihoods have been inserted to the rearrangement unit 1502.

The rearrangement unit 1502 rearranges bits in the received code word. Since the number D of false detection check bits is 14, the rearrangement unit 1320 performs the rearrangement by inserting the last 14 likelihoods of the information bit portion in the received code word (i.e., the bits corresponding to the inserted 24-bit shortening bit likelihoods) into the positions specified by the false detection check bit insertion positions p (the $82^{nd}$, $84^{th}$, $86^{th}$, $88^{th}$, $90^{th}$, $92^{nd}$, $94^{th}$,$96^{th}$, $98^{th}$, $100^{th}$, $102^{nd}$, $104^{th}$, $106^{th}$, and $108^{th}$ bits). The rearrangement unit 1502 transfers the received code word with rearranged bits to the LDPC decode unit 202.

The LDPC decode unit 202 performs LDPC decode processing on the received code word, and transfers the resultant code word to the error detection unit 204 and the rearrangement unit 1503.

The rearrangement unit 1503 relocates the bits located at the false detection check bit insertion positions p (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits) to the end of the information bit portion of the decoded code word. The rearrangement unit 1503 transfers the decoded code word with rearranged bits to the shortening bit removal unit 1504.

The shortening bit removal unit 1504 removes the last 24 bits of the information bit portion, as well as 324 bits corresponding to the parity bit sequence, from the decoded code word transferred from the rearrangement unit 1503. The shortening bit removal unit 1504 outputs the 300 bits obtained as a result of the above removal as a decoded information bit sequence.

The structure of the error detection unit 204 and the processing performed thereby (i.e., processing of comparing the shortening bit likelihoods inserted as false detection check bits with known values used as shortening bits) are the same as those described in Embodiment 1. The descriptions of such structure and processing are hence omitted.

The following description pertains to a case where the number J of information bits is 320 and the number S of shortening bits is 4. The received 620-bit code word is input to the shortening bit insertion unit 1501. The shortening bit insertion unit 1501 inserts 4-bit shortening bit likelihoods between an information bit portion and a parity bit portion (i.e., to the end of the information bit portion) in the received code word. As a result, the information bit portion of the received code word increases by 4 bits. The shortening bit insertion unit 1501 transfers the received code word into which the shortening bit likelihoods have been inserted to the rearrangement unit 1502.

The rearrangement unit 1502 rearranges bits in the received code word. To be more specific, the rearrangement unit 1502 performs the rearrangement by inserting the last 4 likelihoods of the information bit portion in the received code word (i.e., the bits corresponding to the inserted 4-bit shortening bit likelihoods) into, among the false detection check bit insertion positions p, the positions to which the shortening bits have been inserted by the rearrangement unit 1403 of the coding device 1400 in the transmitter device (in the above example, the $82^{nd}$, $84^{th}$, $86^{th}$ and $88^{th}$ bits). The rearrangement unit 1502 transfers the received code word with rearranged bits to the LDPC decode unit 202.

The LDPC decode unit 202 performs LDPC decode processing on the received code word, and transfers the resultant code word to the error detection unit 204 and the rearrangement unit 1503.

The rearrangement unit 1503 relocates, out of the bits located in the false detection check bit insertion positions p, the bits located in the four positions into which the shortening bits have been inserted (the $82^{nd}$, $84^{th}$, $86^{th}$ and $88^{th}$ bits) to the end of the information bit portion of the decoded code word. The rearrangement unit 1503 transfers the decoded code word with rearranged bits to the shortening bit removal unit 1504.

The shortening bit removal unit 1504 removes the last 4 bits of the information bit portion, as well as 324 bits corresponding to the parity bit sequence, from the decoded code word transferred from the rearrangement unit 1503. The shortening bit removal unit 1504 outputs the 320 bits obtained as a result of the above removal as a decoded information bit sequence.

In Embodiment 1, insertion of false detection check bits reduces the throughput of data transfer in proportion to the inserted false detection check bits. In contrast, as has been described in the present Embodiment 2, such a decrease in the throughput can be prevented by following structure: in a case where the length of the information bit sequence is not a multiple of the length of the information bit portion calculated based on the code length and code rate of a code word, known bits that have been originally determined to be inserted to supplement shortage in bits are used as false detection check bits. By using something that has been originally determined to be inserted, there is no necessity to insert new false detection check bits. As a result, a throughput reduction caused by insertion of false detection check bits can be prevented.

With the above-described structure, the decoding device 1500 can decode the received code word and perform error detection on the result of the decoding. The decoding device 1500 pertaining to the present embodiment is configured not only to perform a parity check with use of the parity check matrix H of the LDPC code, but also to check whether a code word obtained after the LDPC decoding is a minimum-distance code word in relation to a corresponding error-free code word.

Accordingly, the decoding device 1500 pertaining to the present embodiment can increase the error detection accuracy to a significant extent as compared to a conventional error detection that only uses the parity check.

The present embodiment has described the structure in which shortening bits are substituted for false detection check bits, and other known bits are not used. However, the present invention is not limited to such structure. For example, when the number of shortening bits is smaller than the number of false detection check bits, known bits may be inserted in addition to the shortening bits so that the total number of known bits and shortening bits equals the number of false detection check bits. This way, the false detection accuracy can still be improved even when the number of shortening bits is smaller than the number of false detection check bits.

[Embodiment 3]

The above embodiment 2 has described the exemplary case where known bits are inserted as false detection check bits when there is shortage in the information length. The present Embodiment 3 describes an exemplary case where other bit values are used as false detection check bits.

<Concepts>

Figures 18A, 18B, 18C, 18D:
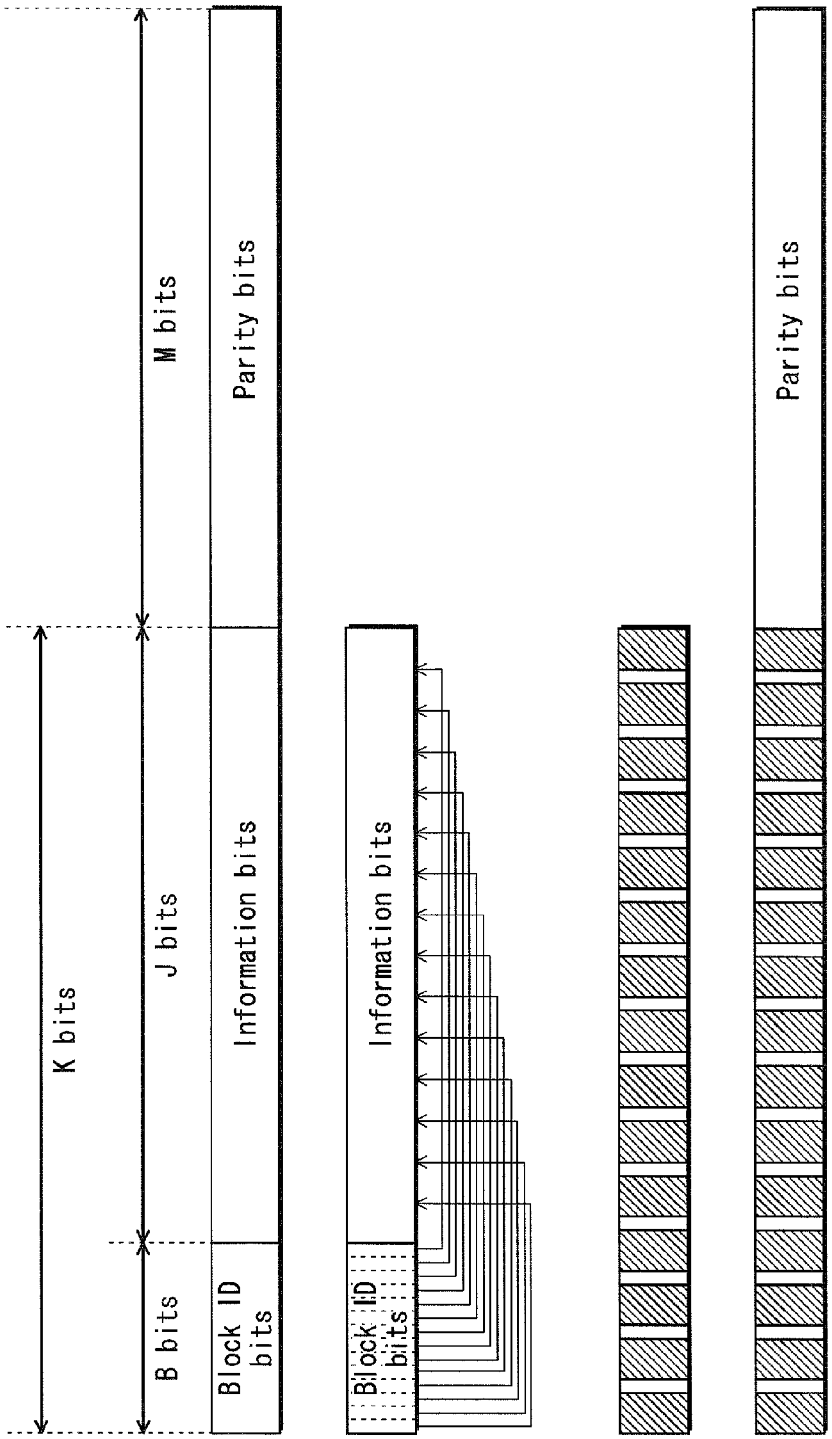
FIG. 18A shows the structure of an LDPC code word including block ID bits.
FIG. 18B is a conceptual diagram showing a concept of coding pertaining to Embodiment 3.
FIG. 18C shows the structure of a pre-coding bit sequence.
FIG. 18D shows the structure of a code word pertaining to Embodiment 3.

When the information length of an information bit portion of a code word, which is determined by a codeword length and a code rate, is shorter than the information length of an information bit sequence to be transmitted, a plurality of code words are generated to transmit data pieces of the information bit sequence to be transmitted. At this time, each of the generated code words is transmitted with block ID bits appended thereto, the block ID bits indicating the order in which the code word is located among all the code words carrying the information bit sequence to be transmitted. As shown in FIG. 18A, each of the code words generated in this case is composed of the following bits: (i) block ID bits that make up the first B bits; (ii) J information bits; and (iii) M parity bits (redundant bits).

Note that K+M bits represent the codeword length, and K bits and M bits are determined by the code rate.

In the present Embodiment 3, values of bits of the appended block ID are inserted as false detection check bits. The transmitted data pieces are basically received in the order indicated by their respective block IDs, and therefore should be decoded according to that order. When the receiver device restores a block ID by extracting bits from the positions where the false detection check bits have been inserted, in some cases the number indicated by that block ID may be different from the order in which the corresponding data piece was received. In such cases, it is assumed that the transmitted data pieces have changed during data transfer, and therefore the received code words are judged as erroneous code words, even if they were judged as error-free code words by the QC-LDPC parity check.

A description is now given of block ID bits included in an LDPC code block. In order to carry out a block retransmission method, it is necessary for the transmitter device and the receiver device to acknowledge which blocks have been or have not been properly transmitted, and which blocks should be selectively retransmitted. One example way to acknowledge such blocks is to insert block ID bits, which are block identifiers, into the LDPC code block. This method makes use of part of bits included in the LDPC code block as block ID bits.

FIGS. 18A through 18D show a bit sequence of an LDPC code into which block ID bits have been inserted. As shown in FIG. 18A, in a bit sequence of an LDPC code into which block ID bits have been inserted, a K-bit information bit sequence of the LDPC code block is composed of B block ID bits and J information bits. Furthermore, code word bits obtained by LDPC coding are made up of (i) the K-bit information sequence including the block ID bits (K=B+J), and (ii) an M-bit parity bit sequence appended to the K-bit information sequence. In addition, values inserted in the block ID bits differ in each LDPC code block.

Note that the block ID bits are inserted to identify the corresponding LDPC code block. Accordingly, there are no rules regarding where the block ID bits should be inserted, as long as the transmitter device and the receiver device both acknowledge the insertion positions of the block ID bits. In view of the above, an error-correction coding device pertaining to the present Embodiment 3 inserts block ID bits into insertion positions of false detection check bits—i.e., the error-correction coding device uses block ID bits as known bits both for identification of the corresponding LDPC code block and for a false detection check. This helps lower the degree of throughput reduction.

FIG. 18A shows a code word to which conventional block ID bits have been appended. In contrast, in the present Embodiment 3, block ID bits appended to the information bit sequence are inserted into the false detection check bit insertion positions that are counted from the beginning of the information bit portion as shown in FIG. 18B. As a result, a pre-coding bit sequence shown in FIG. 18C is generated. And finally, a code word shown in FIG. 18D is generated by coding the pre-coding bit sequence. Note that in FIGS. 18C and 18D, the rectangular portions with diagonal lines represent the information bit portion, and each blank rectangular portion sandwiched between two rectangular portions with diagonal lines represents a block ID bit inserted as a false detection check bit.

<Structure>

Figure 19:
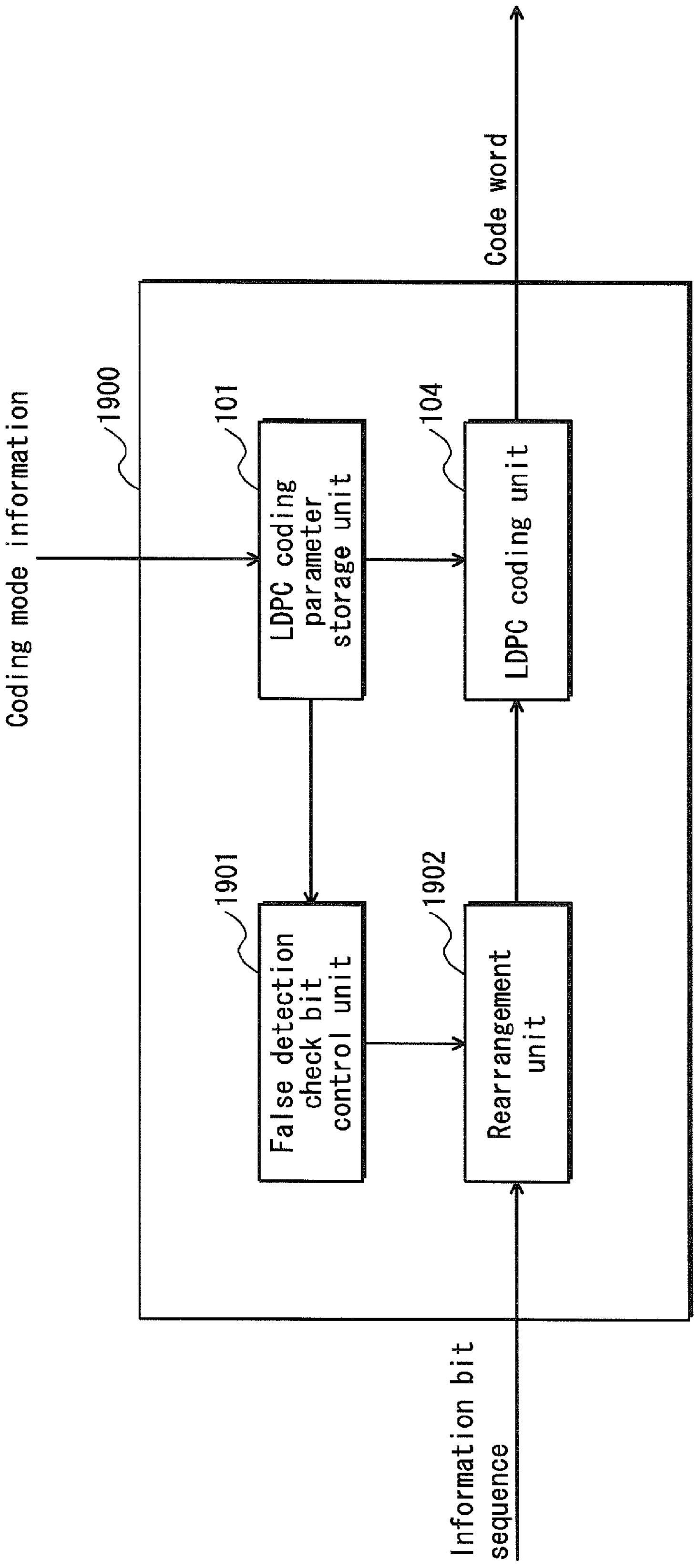
FIG. 19 is a functional block diagram showing a functional structure of a coding device pertaining to Embodiment 3.

FIG. 19 shows a functional structure of a coding device 1900 pertaining to Embodiment 3. As shown in FIG. 19, the coding device 1900 includes an LDPC coding parameter storage unit 101, an LDPC coding unit 104, a false detection check bit control unit 1901, and a rearrangement unit 1902.

The false detection check bit control unit 1901 notifies the rearrangement unit 1902 of the false detection check bit insertion positions notified from the LDPC coding parameter storage unit 101.

The rearrangement unit 1902 generates a pre-coding bit sequence by rearranging the information bit sequence so as to relocate the information bits that make up a block ID to the false detection check bit insertion positions notified from the false detection check bit control unit 1901. Then, the rearrangement unit 1902 outputs the generated pre-coding bit sequence to the LDPC coding unit 104.

Figure 20:
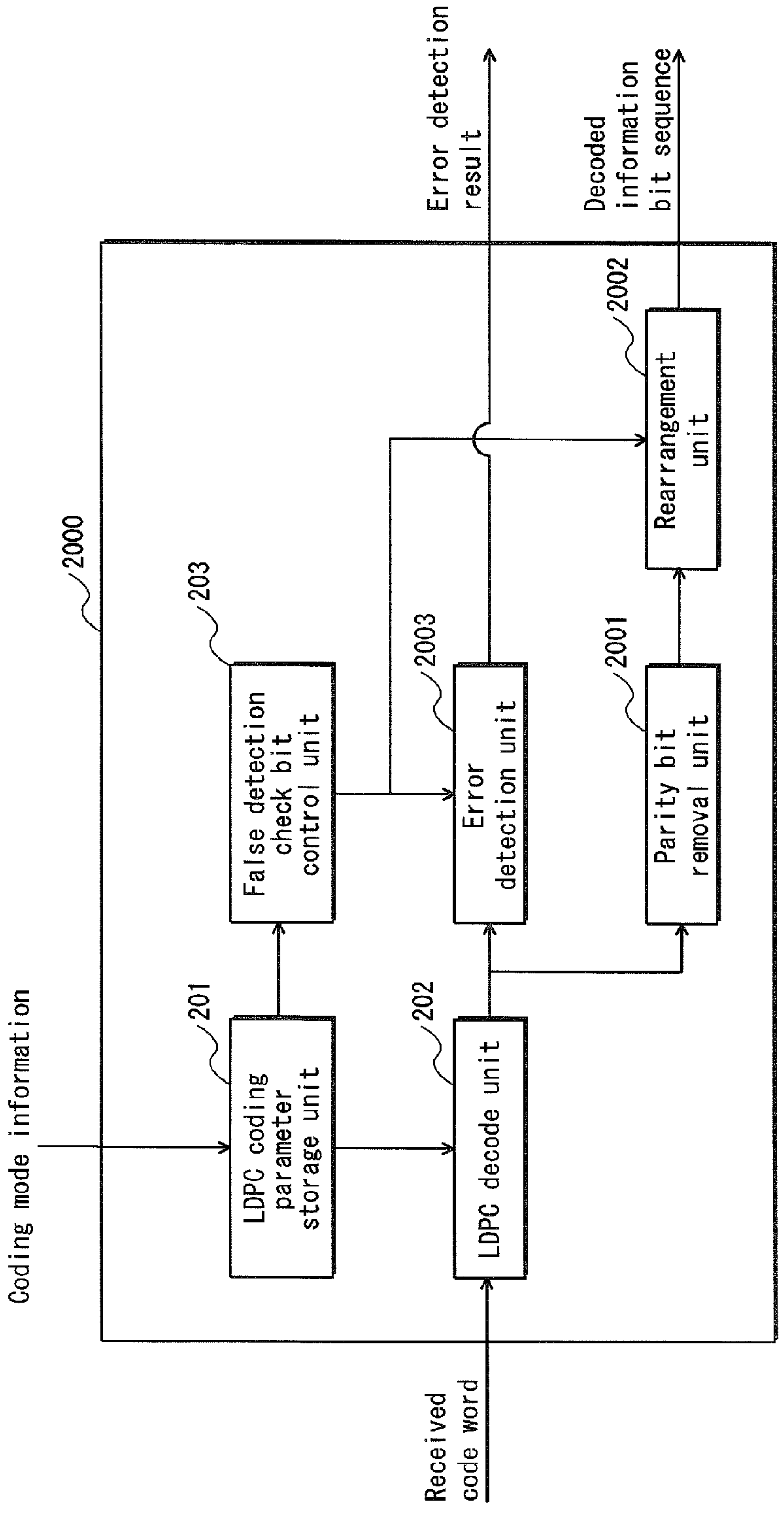
FIG. 20 is a functional block diagram showing a functional structure of a decoding device pertaining to Embodiment 3.

FIG. 20 shows a functional structure of a decoding device 2000 pertaining to Embodiment 3. As shown in FIG. 20, the decoding device 2000 includes an LDPC coding parameter storage unit 201, an LDPC decode unit 202, a false detection check bit control unit 203, a parity bit removal unit 2001, a rearrangement unit 2002, and an error detection unit 2003.

The parity bit removal unit 2001 removes M parity bits from the decoded code word bits output from the LDPC decode unit 202. Thereafter, the parity bit removal unit 2001 transfers only the information bit sequence (i.e., the decoded code word bits excluding the removed parity bits) to the rearrangement unit 2002.

The rearrangement unit 2002 extracts the bits located at the false detection check bit insertion positions, and relocates the extracted bits to the front of the information bit sequence. The rearrangement unit 2002 outputs a decoded information bit sequence, which is obtained by relocating the bits in the false detection check bit insertion positions to the front of the information bit sequence.

The error detection unit 2003 performs error detection on the decoded code word bits transferred from the LDPC decode unit 202. The error detection unit 2003 outputs the error detection result as the output from the decoding device 2000.

Figure 21:
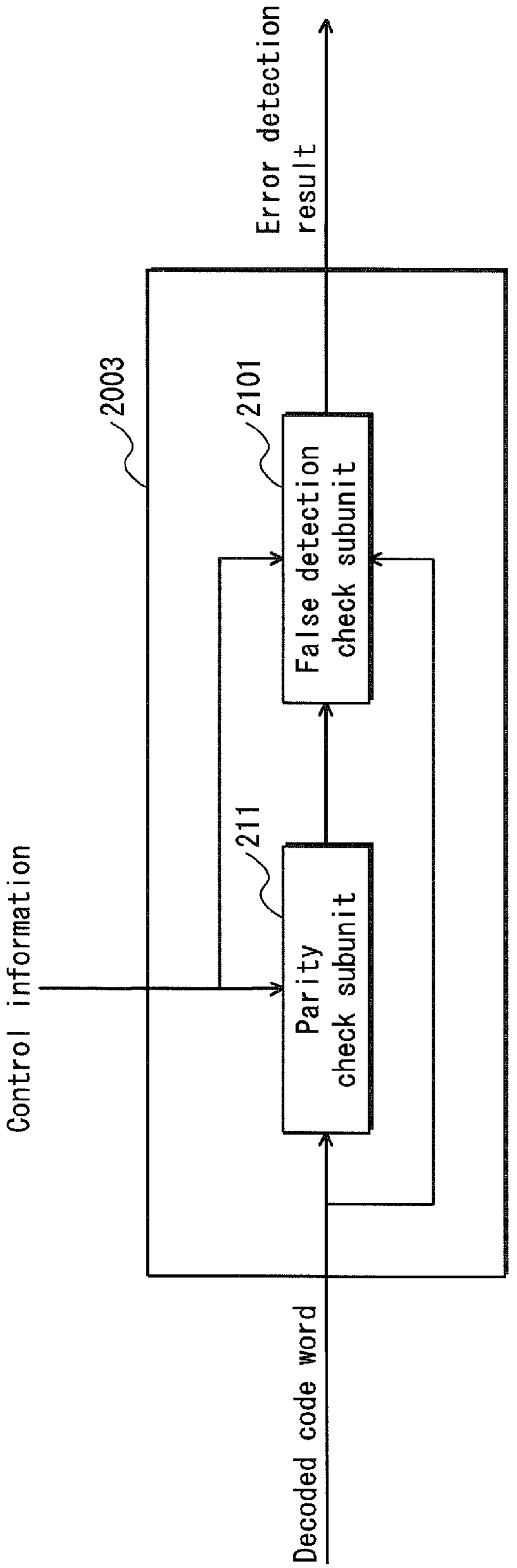
FIG. 21 is a functional block diagram showing a functional structure of an error detection unit pertaining to Embodiment 3.

FIG. 21 shows a detailed structure of the error detection unit 2003. As shown in FIG. 21, the error detection unit 2003 includes a parity check subunit 211 and a false detection check subunit 2101. The parity check subunit 211 performs the same processing as the parity check subunit 211 described in Embodiment 1. Hence, in the following description, a detailed explanation on the parity check subunit 211 is omitted.

When the result of the parity check shows "0", the false detection check subunit 2101 checks the block ID bits inserted in the false detection check bit insertion positions p1. The decoded code word $c_d$, the result of the parity check, and the control information indicating the number, values and insertion positions of false detection check bits are input to the false detection check subunit 2101. The false detection check subunit 2101 judges whether any of the block ID bits holds an erroneous value. If the result of the judgment is affirmative, then the false detection check subunit 2101 judges the block ID bits as containing an error. When the block ID bits inserted in the false detection check bit insertion positions p1 contain an error, its code word is a minimum-distance code word in relation to a corresponding error-free code word, and accordingly the error detection check subunit 2101 judges that there has been a false detection. On the other hand, if none of the block ID bits holds an erroneous value, then the false detection check subunit 2101 judges that there has been no false detection.

One example of a case where a block ID bit holds an erroneous value is when the value of the block ID bit does not match any of multiple values predetermined by the transmitter device and the receiver device. For instance, assume that the transmitter device and the receiver device have determined multiple values to be used as block IDs in advance. Here, if the receiver device finds that at least one of values held by the block ID bits obtained by extracting the bits located in the false detection check bit insertion positions does not match any of the determined multiple values, then the stated at least one of values is judged as an erroneous value.

Another example of a case where a block ID bit holds an erroneous value is when the block ID bit is found as not following the rule predetermined by the transmitter device and the receiver device as a result of comparing the value of the block ID bit with values of the previous and next block ID bits. For instance, assume that LDPC code blocks included in one PHY frame are assigned block IDs representing sequential numbers in order. Here, if a block ID that is not continuous with a block ID of the previous or next LDPC code block is confirmed as a result of the false detection check, then that block ID is judged as erroneous. To be more specific, assume that the LDPC code blocks generated by the transmitter device are assigned sequential numbers (e.g., 01, 02, 03, 04, and so on), and these sequential numbers are also used as block IDs. Here, if the receiver device finds that the block IDs located in the false detection check bit insertion positions show 01, 02, 13 and 04, respectively, then the LDPC code block including the block ID bits showing 13 can be judged as erroneous, even when a corresponding code word is a code word of the LDPC code.

The false detection check subunit 2101 outputs a result of the false detection check in format that can be interpreted by software or hardware. For example, the false detection check subunit 2101 outputs "0" when no false detection has been confirmed, and "1" when a false detection has been confirmed. The result of the false detection check output from the false detection check subunit 2101 is also a result of the error detection output from the error detection unit 2003. On the other hand, when the result of the parity check shows "1", it is obvious that the decoded code word $c_d$ is not a code word of the LDPC code and is thus erroneous. In this case, there is no need to perform the false detection check. Therefore, in this case, the false detection check subunit 2101 outputs "1" as a result of the false detection check without performing the false detection check.

<Operations>

Figure 22:
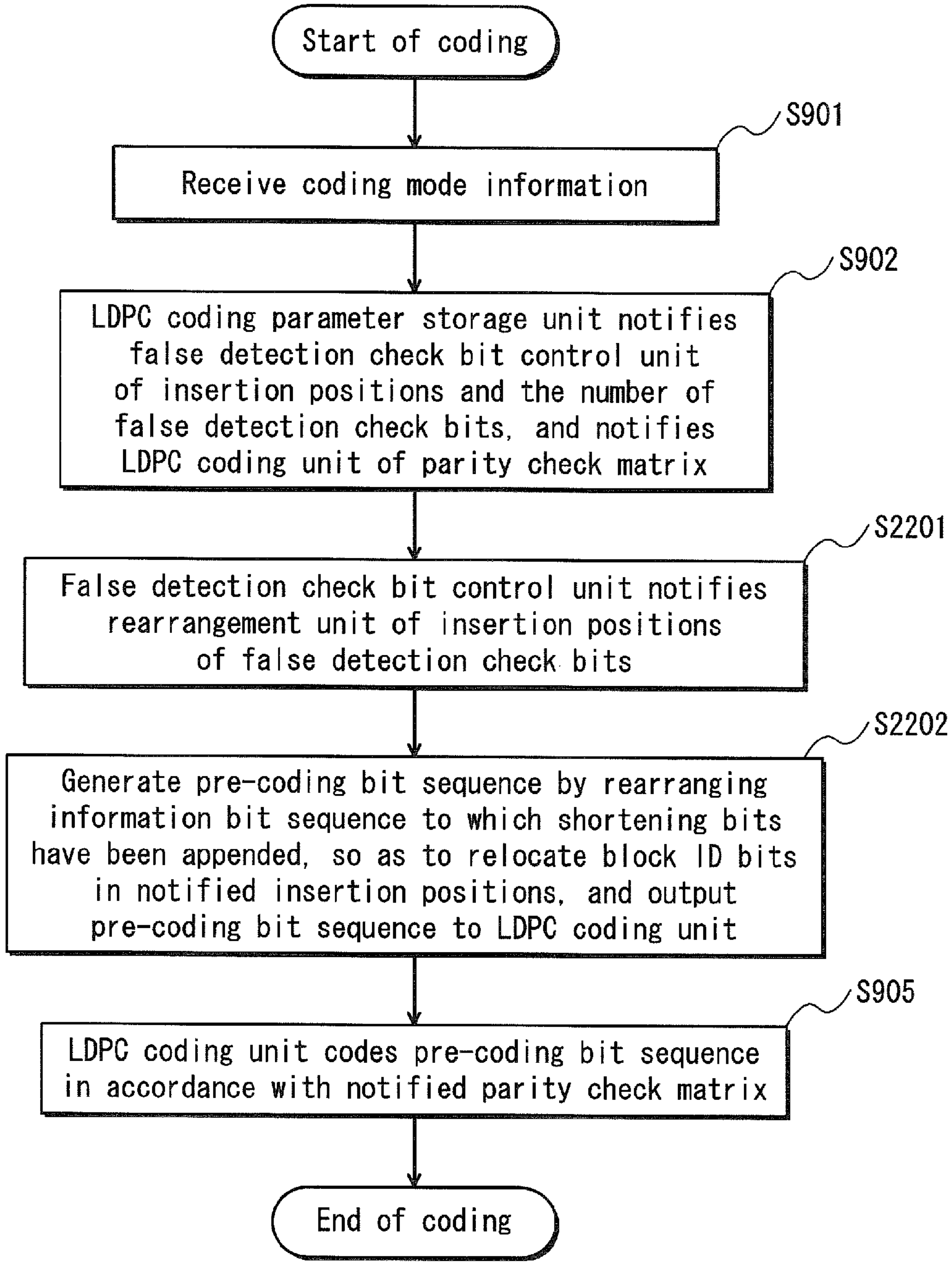
FIG. 22 is a flowchart showing coding operations performed by a coding device pertaining to Embodiment 3.

A description is now given of coding operations performed by the coding device 1900 with reference to the flowchart of FIG. 22. In the following description, only the operations that are different from those shown in FIG. 9 pertaining to Embodiment 1 are discussed.

The false detection check bit control unit 1901 notifies the rearrangement unit 1902 of the false detection check bit insertion positions (step S2201).

Then, the rearrangement unit 1902 generates a pre-coding bit sequence by rearranging the information bit sequence in accordance with the notified false detection check bit insertion positions, so as to relocate block ID bits, which are originally located at the front of an information portion of the information bit sequence, to the false detection check bit insertion positions. Thereafter, the rearrangement unit 1902 transfers the generated pre-coding bit sequence to the LDPC coding unit 104 (step S2202).

Described below is one specific example of the coding operations performed by the coding device 1900.

More specifically, the following describes operations performed by the coding device 1900 with use of an LDPC code defined by the parity check matrix Hb648 shown in FIG. 1 and having a code length of 648 bits and a code rate of 1/2 as specified in IEEE 802.11n.

The transmitter device inputs, to the coding device 1900, coding mode information as well as an information bit sequence containing block ID bits. Here, assume that the first 8 bits of the information bit sequence are the block ID bits. In this case, B=8. The coding mode information is input to the LDPC coding parameter storage unit 101. In accordance with the input coding mode information, the LDPC coding parameter storage unit 101 sets parameters required for LDPC coding in the false detection check bit control unit 1901 and the LDPC coding unit 104. Examples of the parameters set in the false detection check bit control unit 1901 include B false detection check bit insertion positions p1 (e.g., the $82^{nd}$, $84^{th}$, $86^{th}$, $88^{th}$, $90^{th}$, $92^{nd}$, $94^{th}$, and $96^{th}$ bits). Examples of the parameters set in the LDPC coding unit 104 include the code length N (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

The 324-bit information bit sequence containing the 8 block ID bits is input to the rearrangement unit 1902.

The rearrangement unit 1902 rearranges the 324-bit information bit sequence. To be more specific, the rearrangement unit 1902 rearranges (i) the block ID bits, which make up the first 8 bits of the information bit sequence, and (ii) the bits located in the false detection check bit insertion positions p1, namely the $82^{nd}$, $84^{th}$, $86^{th}$, $88^{th}$, $90^{th}$, $92^{nd}$, $94^{th}$, and $96^{th}$ bits. The makes the bits located in the false detection check bit insertion positions p1 the block ID bits. The rearrangement unit 1902 transfers the rearranged information bit sequence to the LDPC coding unit 104. In performing the rearrangement processing, the rearrangement unit 1902 may use any rearrangement rule as long as it can rearrange the bits located in the false detection check bit insertion positions p1 and the block ID bits.

The LDPC coding unit 104 performs LDPC coding processing on the input pre-coding information bit sequence, generates a 324-bit redundant bit sequence, combines the generated 324-bit redundant bit sequence with the 324-bit coded information bit sequence, and finally outputs a result of the combination as a 648-bit code word as the output from the coding device 1900.

Figure 23:
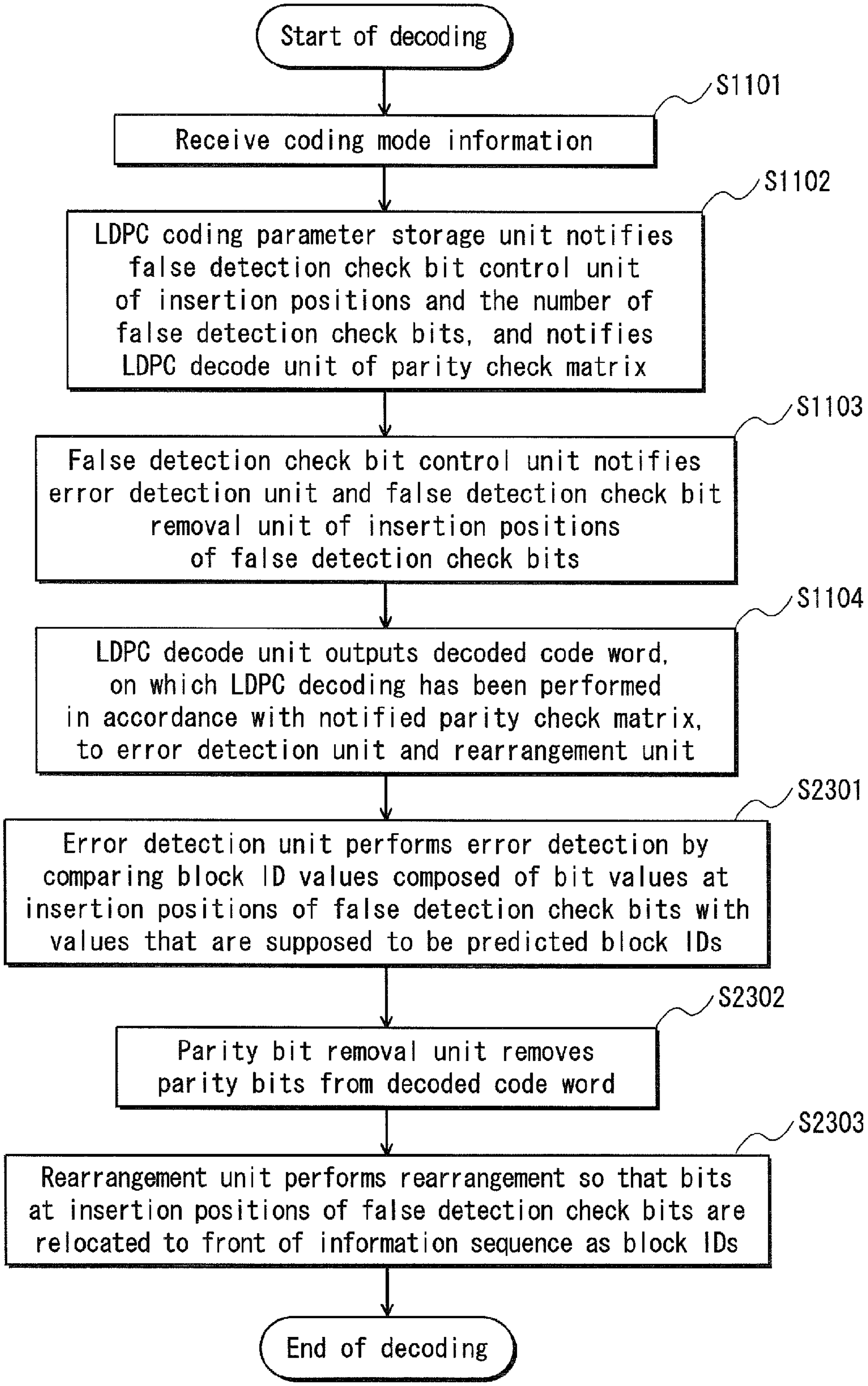
FIG. 23 is a flowchart showing decoding operations performed by a decoding device pertaining to Embodiment 3.

With reference to the flowchart of FIG. 23, the following describes operations performed by the decoding device 2000 upon receiving the code word that has been generated in the above manner, modulated, and transmitted. In the following description, only the operations that are different from those shown in FIG. 11 pertaining to Embodiment 1 are discussed.

In step S2301, the error detection unit 2003 performs the error detection in the following manner. After the parity check is performed by the parity check subunit 211, the false detection check subunit 2101 judges whether the block ID bits located in the false detection check bit insertion positions have the same values as predicted bit values by comparing the block ID bits with the predicted bit values. The false detection check subunit 2101 then outputs a result of the error detection. For example, in a case where the transmitter device and the receiver device have made it a rule to use some of predetermined values as block ID bits, the false detection check subunit 2101 detects whether the block ID bits hold said some of predetermined values. Alternatively, in a case where the order of sequential code blocks is to be checked, the false detection check subunit 2101 detects whether each block ID bit is continuous with a block ID bit of the previous or next LDPC code block. In the latter case, the false detection check subunit 2101 detects whether each block ID matches a block ID predicted from the block ID of the previous or next LDPC code block by comparing the two (step S2301).

The parity bit removal unit 2301 removes M parity bits from the decoded code word, and transfers only the information bit sequence to the rearrangement unit 2002 (step S2302).

Thereafter, the rearrangement unit 2002 rearranges the information bit sequence by relocating the bits located in the false detection check bit insertion positions to the front of the information bit sequence. The rearrangement unit 2002 generates a decoded information bit sequence through this procedure, and outputs the decoded information bit sequence (step S2303).

Described blow is one specific example of the decoding operations performed by the decoding device 2000.

More specifically, the following describes operations performed by the decoding device 2000 with use of an LDPC code defined by the parity check matrix Hb648 shown in FIG. 1 and having a code length of 648 bits and a code rate of 1/2 as specified in IEEE 802.11n.

Before the received code word is input, the coding mode information is input to the decoding device 2000. In accordance with the coding mode information, the LDPC coding parameter storage unit 201 transfers LDPC coding parameters which are stored in correspondence with the received coding mode information to the LDPC decode unit 202 and the false detection check bit control unit 203. Examples of the parameters set in the false detection check bit control unit 203 include the number of false detection check bits, namely 14, and false detection check bit insertion positions p (the $82^{nd}$, $84^{th}$, $86^{th}$, $88^{th}$, $90^{th}$, $92^{nd}$, $94^{th}$, $96^{th}$, $98^{th}$, $100^{th}$, $102^{nd}$, $104^{th}$, $106^{th}$, and $108^{th}$ bits). Examples of the parameters set in the LDPC decode unit 202 include the code length N (648 bits), the information bit length K (324 bits), the redundant bit length M (324 bits), the parity check matrix H (or an address of the memory storing therein information relating to the parity check matrix H), and in a case where different processing is performed for each coding mode, a signal indicating which processing is to be performed.

After the parameters to be used are set, the decoding device 2000 begins LDPC decode processing on the received code word. The received 648-bit code word is input to the LDPC decode unit 202. At this time, in the received code word, one bit may carry one-bit information (hard-decision decoding), or one bit may carry multiple-bit information (soft-decision decoding). In the case of soft-decision decoding, log-likelihood ratios of quantized code word bits may be used as the received code word.

The LDPC decode unit 202 performs LDPC decode processing on the received code word, and transfers the resultant code word to the parity bit removal unit 2001 and the error detection unit 2003.

The parity bit removal unit 2001 removes M parity bits from the code word transferred from the LDPC decode unit 202, and outputs only the K-bit information bit sequence to the rearrangement unit 2002.

The parity check subunit 211 included in the error detection unit 2003 checks whether the decoded code word $c_d$ that has been input and the parity check matrix H of the LDPC code that has been provided as control information satisfy the parity check $Hc_d=0$. The parity check subunit 211 outputs a result of the parity check in format that can be interpreted by software or hardware.

When the result of the parity check shows "0", the false detection check subunit 2101 checks the block ID bits inserted in the false detection check bit insertion positions p1. The false detection check subunit 2101 judges whether any of the block ID bits holds an erroneous value. If the result of the judgment is affirmative, then the false detection check subunit 2101 judges the block ID bits as containing an error. When the block ID bits inserted in the false detection check bit insertion positions p1 contain an error, its code word is a minimum-distance code word in relation to a corresponding error-free code word, and accordingly the error detection check subunit 2101 judges that there has been a false detection. For instance, assume that LDPC code blocks included in one PHY frame are assigned block IDs representing sequential numbers in order. Here, if a block ID that is not continuous with a block ID of the previous or next LDPC code block is found as a result of the false detection check, then that block ID is judged as erroneous.

The false detection check subunit 2101 outputs a result of the false detection check in format that can be interpreted by software or hardware. For example, the false detection check subunit 212 outputs "0" when no false detection has been confirmed, and "1" when a false detection has been confirmed. The result of the false detection check output from the false detection check subunit 2101 is also a result of the error detection output from the error detection unit 2003. On the other hand, when the result of the parity check shows "1", it is obvious that the decoded code word $c_d$ is not a code word of the LDPC code and is therefore erroneous. In this case, there is no need to perform the false detection check. Therefore, in this case, the false detection check subunit 2101 outputs "1" as a result of the false detection check without performing the false detection check.

As described above, in the present Embodiment 3, ID block bits that are originally determined to be appended are used as false detection check bits. This allows suppressing the throughput reduction caused by insertion of new false detection check bits. Furthermore, in the present Embodiment 3, the false detection check is performed by comparing the order based on numerical values obtained through decoding of ID blocks with the order in which the ID blocks are actually received. That is, one advantage of the present Embodiment 3 is that neither the transmitter device nor the receiver device needs to determine what kind of bits are to be used as false detection check bits (i.e., known bits).

With the above-described structure, the decoding device 2000 can decode the received code word and perform error detection on the result of the decoding. The decoding device 2000 pertaining to the present Embodiment 3 is configured not only to perform a parity check with use of the parity check matrix H of the LDPC code, but also to check whether a code word obtained after the LDPC decoding is a minimum-distance code word in relation to a corresponding error-free code word. Accordingly, the decoding device 2000 pertaining to the present Embodiment 3 can increase the error detection accuracy to a significant extent as compared to a conventional error detection that only uses the parity check.

As per the above Embodiment 2, when the number of block ID bits is smaller than the number required as false detection check bits, extra false detection check bits may be generated and inserted as described in the above Embodiment 1.

<Supplementary Notes>

The above embodiments have described methods for implementing the present invention. However, it goes without saying that the present invention is not limited to these embodiments. The following describes various modification examples that are included as the present invention in addition to the above embodiments.

(1) The examples described in the above embodiments conform to the IEEE 802.11n standard. However, communication conforming to a standard other than the IEEE802.11n standard may be performed as long as the following aim is accomplished: a false detection (i.e., judging an erroneous code word as an error-free code word) is prevented by, in the course of QC-LDPC coding, inserting bits for preventing the false detection (i.e., false detection check bits) into certain positions in an information bit sequence to be transmitted, the certain positions being different between (i) an original code word obtained by coding the information bit sequence and (ii) a code word that is judged as an error-free code word by the parity check but is different from the original code word with a close Hamming distance therebetween. In this case, the parity check matrix to be used and the false detection check bit insertion positions, which both vary depending on the codeword length and code rate pertaining to the adopted standard, should be calculated in advance.

(2) In the above embodiments, the insertion position determination table is prestored in the receiver device. However, alternatively, the insertion position determination table may be transmitted from the transmitter device to the receiver device based on a conventional communication method. Note that in this case, the insertion position determination table is transmitted prior to the data transfer described in the above embodiments—i.e., transfer of data that has been coded with false detection check bits inserted therein.

(3) As apparent from FIG. 4, a communication device pertaining to the above embodiments is illustrated as if it has only one antenna for the sake of convenience. However, a communication device of the present invention is not limited to such structure; it may have multiple antennas.

Figure 24:
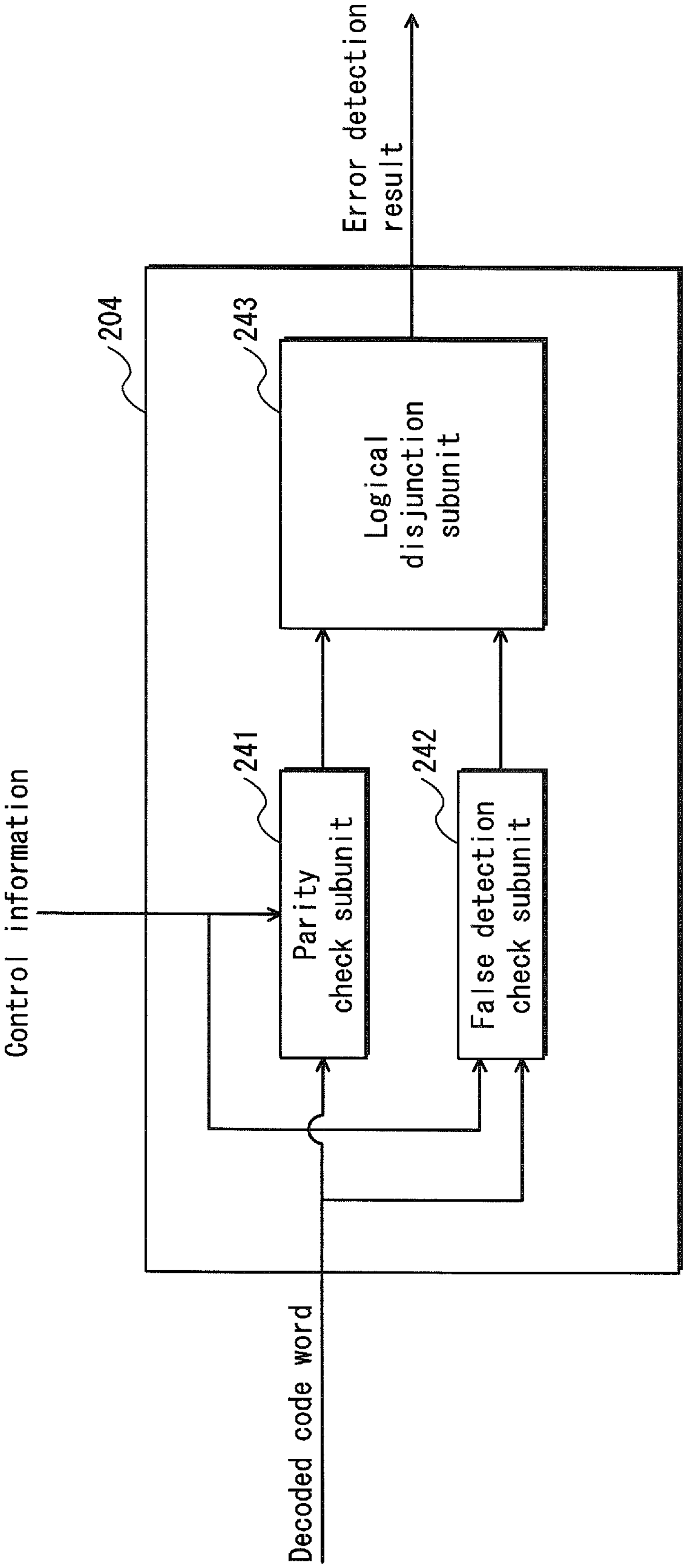
FIG. 24 is a functional block diagram showing an example of an alternative structure for an error detection unit.
Figure 25:
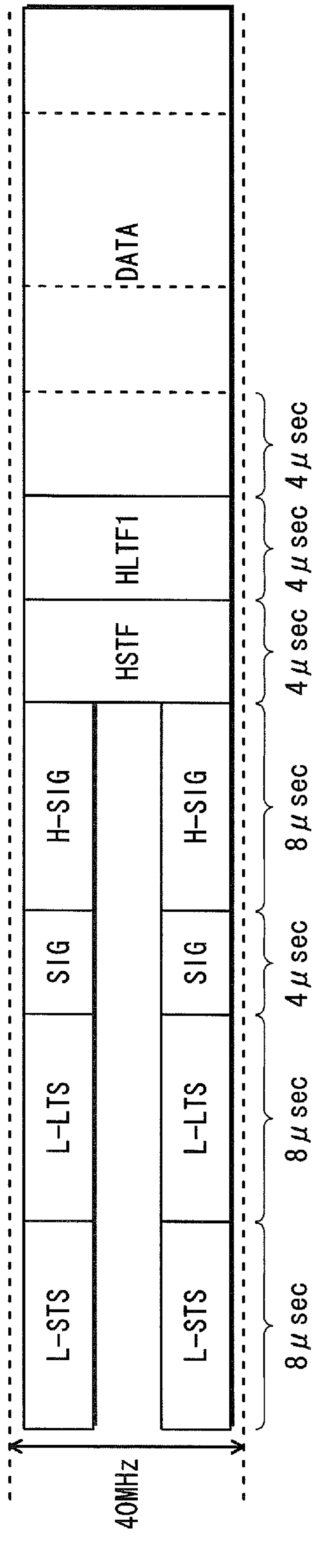
FIG. 25 is a data structure diagram showing a frame structure of signals exchanged between communication devices.
Figure 26:
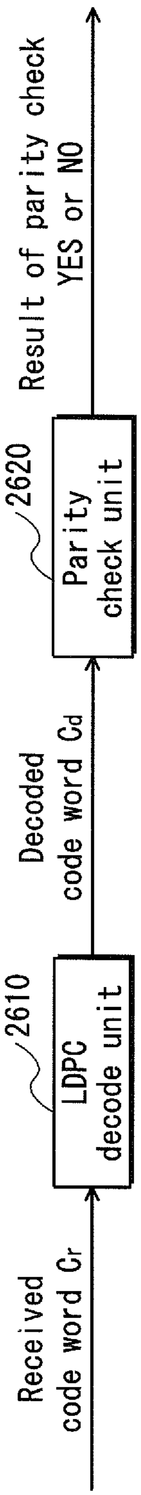
FIG. 26 shows a concept of conventional LDPC decoding.

(4) In the above Embodiments 1 through 3, the false detection check subunit has been described as not performing the false detection check when the code word subjected to LDPC decoding does not satisfy the parity check. This is simply because there is no need to perform a false detection check. Alternatively, it is permissible to perform a false detection check regardless of the result of the parity check. In this case, a logical disjunction is performed on the result of the parity check and the result of false detection check, and a value obtained from the logical disjunction is output as the error detection result. FIG. 24 shows one exemplary structure of error detection units 204 and 2003 that can perform the above logical disjunction.

A parity check subunit 241 and a false detection check subunit 242 shown in FIG. 24 are substantially the same as the parity check subunit 211 and the false detection check subunit 212 shown in FIG. 7, respectively. The parity check subunit 241 judges whether the decoded bit sequence that has been input satisfies the parity check. The false detection check subunit 242 judges whether values held by the bits located in the false detection check bit insertion positions are different from values predetermined as the false detection check bits. The judgment results output from the parity check subunit 241 and the false detection check subunit 242 are the same as in the above Embodiment 1.

Upon receiving values of the judgment results output from the parity check subunit 241 and the false detection check subunit 242, a logical disjunction subunit 243 performs a logical disjunction on these values, and outputs a value obtained from the logical disjunction as the error detection result.

This concludes the description of one exemplary structure of the error detection unit 204.

(5) In the above embodiments, a code word having the minimum Hamming distance in relation to a transmitted code word is identified ahead of time, and predetermined bit values for preventing a false detection are inserted into positions that are different between the code word having the minimum Hamming distance and the transmitted code word. Alternatively, such predetermined bit values for preventing a false detection may be inserted into positions that are different between a code word having the second or third closest Hamming distance in relation to a transmitted code word, in addition to positions that are different between the code word having the minimum Hamming distance and the transmitted code word. This enables further improvement in the rate at which a false detection is prevented.

In a case where an experiment or the like leads to the finding that a transmitted code word easily changes into another code word that is different from a code word having the minimum Hamming distance in relation to the transmitted code word, the false detection check bits may be inserted into positions that have different bit values between the transmitted code word and the stated code word that easily changes into another code word, instead of positions that have different bit values between the transmitted code word and the minimum-distance code word.

(6) With regard to each flowchart explained in the above embodiments (with reference to, for example, FIGS. 9, 11, 16, 17, 22 and 23), the coding device and decoding device do not necessarily have to operate in the order illustrated therein, as long as the functional units of the coding device and decoding device have received necessary information by the time when they execute their respective processing. Therefore, parts of the processing performed by each of these functional units may be executed in parallel when possible. It is also permissible to rearrange the order of processing of each flowchart explained in the above embodiments. For example, steps S1104, S1105 and S1106 in FIG. 11 may be executed in parallel. Alternatively, steps S1105 and S1106 may be executed before step S1104. Similarly, steps S1601 and S1602 in FIG. 16 may be executed in parallel. Alternatively, step S1602 may be executed before step S1601.

(7) Each of the functional units included in the coding device and decoding device illustrated in FIGS. 5, 6, 7, 14, 15, 19, 20 and 21 may be integrated and realized as one or more LSIs (Large Scale Integrations). Alternatively, two or more of such functional units may be collectively realized as a single LSI.

Here, the LSI may be an IC (Integrated Circuit), a system LSI, a VLSI (Very Large Scale Integration), an SLSI (Super Large Scale Integration), or a ULSI (Ultra Large Scale Integration), depending on the degree of integration.

Furthermore, the integration of circuits is not limited to being realized with LSI, but may be realized with a special-purpose circuit or a general-use processor. Alternatively, the integration may be realized with use of an FPGA (field programmable gate array) that is programmable after manufacturing of the LSI, or a re-configurable processor that enables re-configuration of the connection and settings of circuit cells in the LSI.

Furthermore, if technology for an integrated circuit that replaces LSIs appears due to advances in or derivations from semiconductor technology, that technology may be used for integration of functional blocks. Biotechnology is one possible application.

(8) The operations and processing described in the above embodiments, such as coding/decoding operations and processing of inserting false detection bits (for example, see FIGS. 9, 11, 16, 17, 22 and 23), may be executed by processors included in the transmitter device, receiver device, and the like, or by various circuits connected to such processors. A control program composed of program codes for causing the processors and various circuits to execute such operations and processing may be recorded on a recording medium, or distributed/disseminated via different types of communication channels. Examples of such a recording medium include an IC card, a hard disk, an optical disc, a flexible disk, and a ROM. Once the distributed/disseminated control program is stored into memory or the like that can be read by processors, the control program can be provided for use. Here, the various functions described in the above embodiments can be realized by the processors executing the control program.

INDUSTRIAL APPLICABILITY

A coding device and a decoding device pertaining to the present invention can reduce the rate of false detection whereby an erroneous code word is judged as an error-free code word during a QC-LDPC parity check, without reducing the throughput of data transfer as compared to a case where a CRC code or the like is used. Accordingly, an effective use of such coding device and decoding device can be expected in communication systems.

REFERENCE SIGNS LIST

100, 1400, 1900 coding device
101 LDPC coding parameter storage unit
102, 1401, 1901 false detection check bit control unit
103 false detection check bit insertion unit
104 LDPC coding unit
200, 1500, 2000 decoding device
201 LDPC coding parameter storage unit
202 LDPC decode unit
203 false detection check bit control unit
204, 2003 error detection unit
205 false detection check bit removal unit
211 parity check subunit
212, 2101 false detection check subunit
1402 shortening bit insertion unit
1403 rearrangement unit
1404 shortening bit removal unit
1501 shortening bit insertion unit
1502 rearrangement unit
1503 rearrangement unit
1504 shortening bit removal unit
2001 parity bit removal unit
2002 rearrangement unit

The invention claimed is:

1. A coding device for coding an information bit sequence and outputting the coded information bit sequence, comprising:

a determining unit operable to, in accordance with an applied coding method that utilizes a quasi-cyclic code, determine at least one bit position in the information bit sequence as an insertion position into which a false detection check bit value for preventing a receiver device from falsely detecting an erroneous code word as an error-free code word is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method, and the second code word being different from the first code word by the minimum Hamming distance;

an inserting unit operable to generate a pre-coding bit sequence by inserting the false detection check bit value into the insertion position of the information bit sequence; and a coding unit operable to generate a third code word by coding the pre-coding bit sequence in accordance with the coding method.

2. The coding device of claim 1, further comprising a known bit appending unit operable to append at least one known bit, which has been predetermined as a shortening bit of a shortening code, to the information bit sequence when an information length of the information bit sequence is shorter than an information length of an information bit portion of a code word determined based on a codeword length and a code rate pertaining to the coding method, wherein the inserting unit rearranges the information bit sequence to which the known bit has been appended, so that the known bit is inserted into the insertion position as the false detection check bit value.

3. The coding device of claim 2, further comprising a removing unit operable to remove one or more of the at least one known bit appended by the known bit appending unit from the third code word.

4. The coding device of claim 1, wherein the third code word generated by the coding unit includes a block ID for identifying the third code word among other third code words, and the inserting unit inserts a bit value of a bit representing the block ID into the insertion position as the false detection check bit value.

5. A decoding device comprising:

a decoding unit operable to generate a decoded bit sequence by performing decode processing on a pre-decoding bit sequence input thereto, the decode processing complying with an applied coding method that utilizes a quasi-cyclic code;

a checking unit operable to check whether the decoded bit sequence is judged as an error-free code word by a parity check of the coding method;

a judging unit operable to judge whether at least one insertion position in the decoded bit sequence holds at least one false detection check bit value for preventing the decoding device from falsely detecting an erroneous code word as an error-free code word, wherein according to the coding method, a bit position in a first code word which corresponds to the insertion position is predetermined to hold a different bit value from a bit position in a second code word which corresponds to the insertion position, the first code word being generated by a transmitter device according to the coding method, the second code word being judged as an error-free code word by the parity check, and the second code word being different from the first code word by the minimum Hamming distance; and an error detecting unit operable to, in a case where the judging unit judges in the negative, judge that the decoded bit sequence is erroneous even when a result of the checking by the checking unit shows that the decoded bit sequence has been judged as the error-free code word by the parity check.

6. The decoding device of claim 5, further comprising an inserting unit operable to, when a pre-decoding shortened code word from which one or more of the at least one false detection check bit value have been removed by the transmitter device is input thereto, generate the pre-decoding bit sequence by inserting at least one known bit holding a known value into the input pre-decoding shortened code word.

7. The decoding device of claim 5, wherein the judging unit judges whether the insertion position in the decoded bit sequence holds a bit value that can be predicted from a false detection check bit value of another decoded bit sequence instead of judging whether the insertion position in the decoded bit sequence holds the at least one false detection check bit value.

8. A coding method executed by a coding device for coding an information bit sequence, the coding method comprising the steps of:

(A) determining, in accordance with an applied coding method that utilizes a quasi-cyclic code, at least one bit position in the information bit sequence as an insertion position into which a false detection check bit value for preventing a receiver device from falsely detecting an erroneous code word as an error-free code word is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method, and the second code word being different from the first code word by the minimum Hamming distance;

(B) generating a pre-coding bit sequence by inserting the false detection check bit value into the insertion position of the information bit sequence; and (C) generating a third code word by coding the pre-coding bit sequence in accordance with the coding method.

9. A decoding method executed by a decoding device, the decoding method comprising the steps of:

(A) generating a code word by decoding a received signal in accordance with an applied coding method that utilizes a quasi-cyclic code;

(B) checking whether the code word generated in the step (A) is an error-free code word by a parity check of the coding method;

(C) judging whether at least one insertion position in the generated code word holds at least one false detection check bit value for preventing the decoding device from falsely detecting an erroneous code word as an error-free code word, wherein according to the coding method, a bit position in a first code word which corresponds to the insertion position is predetermined to hold a different bit value from a bit position in a second code word which corresponds to the insertion position, the first code word being generated by a transmitter device according to the coding method, the second code word being judged as an error-free code word by the parity check, and the second code word being different from the first code word by the minimum Hamming distance; and (D) in a case where the judgment in the step (C) is in the negative, judging that the generated code word is erroneous even when a result of the checking by the step (B) shows that the generated code word has been judged as the error-free code word by the parity check.

10. A communication system including a transmitter device and a receiver device, the transmitter device, which codes an information bit sequence and transmits the coded information bit sequence, comprising:

a determining unit operable to, in accordance with an applied coding method that utilizes a quasi-cyclic code, determine at least one bit position in the information bit sequence as an insertion position into which a false detection check bit value for preventing the receiver device from falsely detecting an erroneous code word as an error-free code word is to be inserted, wherein a bit position in a first code word which corresponds to the insertion position holds a different bit value from a bit position in at least one second code word which corresponds to the insertion position, the first code word being obtained by coding the information bit sequence in accordance with the coding method, the second code word being judged as an error-free code word by a parity check of the coding method, and the second code word being different from the first code word by the minimum Hamming distance;

an inserting unit operable to generate a pre-coding bit sequence by inserting the false detection check bit value into the insertion position of the information bit sequence;

a coding unit operable to generate a third code word by coding the pre-coding bit sequence in accordance with the coding method; and a transmitting unit operable to transmit a wireless signal containing the third code word, the receiver device comprising:

a receiving unit operable to receive the wireless signal;

a decoding unit operable to generate a code word by decoding the received signal in accordance with the coding method;

a checking unit operable to check whether the code word generated by the decoding unit is judged as an error-free code word by the parity check of the coding method;

a judging unit operable to judge whether at least one insertion position in the generated code word holds at least one false detection check bit value, wherein according to the coding method, a bit position in a first code word which corresponds to the insertion position is predetermined to hold a different bit value from a bit position in a second code word which corresponds to the insertion position, the first code word being generated by the transmitter device according to the coding method, the second code word being judged as an error-free code word by the parity check, and the second code word being different from the first code word by the minimum Hamming distance; and an error detecting unit operable to, in a case where the judging unit judges in the negative, judge that the generated code word is erroneous even when a result of the checking by the checking unit shows that the generated code word has been judged as the error-free code word by the parity check.

* * * * *